(12) United States Patent
Luther et al.

(10) Patent No.: US 10,273,403 B2
(45) Date of Patent: Apr. 30, 2019

(54) NANOPARTICLES FOR PHOTOVOLTAIC AND LED DEVICES AND METHODS OF MAKING THE SAME

(71) Applicants: Alliance for Sustainable Energy, LLC, Golden, CO (US); Abhishek Swarnkar, Jharkhand (IN); The Regents of the University of Colorado, a body corporate, Denver, CO (US); University of Washington, Seattle, WA (US)

(72) Inventors: Joseph Matthew Luther, Boulder, CO (US); Abhishek Swarnkar, Jharkhand (IN); Ashley Rae Marshall, Golden, CO (US); Erin Mariko Sanehira, Lakewood, CO (US)

(73) Assignees: Alliance for Sustainable Energy, LLC, Golden, CO (US); University of Washington, Seattle, WA (US); Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/609,401

(22) Filed: May 31, 2017

(65) Prior Publication Data

US 2017/0342316 A1    Nov. 30, 2017

Related U.S. Application Data

(60) Provisional application No. 62/343,251, filed on May 31, 2016, provisional application No. 62/464,946, filed on Feb. 28, 2017.

(51) Int. Cl.
C09D 5/22    (2006.01)
C09D 5/24    (2006.01)
(Continued)

(52) U.S. Cl.
CPC ............. *C09K 11/025* (2013.01); *C09D 5/22* (2013.01); *C09D 5/24* (2013.01); *C09D 7/67* (2018.01); *C09K 11/665* (2013.01); *H01G 9/20* (2013.01); *H01L 31/02167* (2013.01); *H01L 33/44* (2013.01); *H01L 51/426* (2013.01); *H01L 51/448* (2013.01); *H01L 51/5237* (2013.01); *B82Y 20/00* (2013.01); *B82Y 30/00* (2013.01);
(Continued)

(58) Field of Classification Search
CPC ....................................................... H01L 21/02
USPC .......................................... 136/258; 438/478
See application file for complete search history.

(56) References Cited

U.S. PATENT DOCUMENTS 7,517,718 B2    4/2009 Mitzi et al.
7,700,200 B2    4/2010 Bulovic et al.
(Continued)

OTHER PUBLICATIONS

International Search Report from corresponding PCT patent application, PCT/US17/35156, dated Sep. 1, 2017, 3 pages.
(Continued)

*Primary Examiner* — Khanh T Nguyen
(74) *Attorney, Agent, or Firm* — Michael A. McIntyre

(57) ABSTRACT

The present disclosure relates to a composition that includes a particle and a surface species, where the particle has a characteristic length between greater than zero nm and 100 nm inclusively, and the surface species is associated with a surface of the particle such that the particle maintains a crystalline form when the composition is at a temperature between −180° C. and 150° C.

25 Claims, 33 Drawing Sheets

(51) Int. Cl.
C09K 11/02 (2006.01)
C09K 11/66 (2006.01)
H01G 9/20 (2006.01)
H01L 31/0216 (2014.01)
H01L 33/44 (2010.01)
H01L 51/44 (2006.01)
H01L 51/52 (2006.01)
C09D 7/40 (2018.01)
H01L 51/42 (2006.01)
B82Y 20/00 (2011.01)
B82Y 30/00 (2011.01)
B82Y 40/00 (2011.01)
H01L 31/0352 (2006.01)
H01L 33/04 (2010.01)

(52) U.S. Cl.
CPC ....... B82Y 40/00 (2013.01); H01L 31/035218 (2013.01); H01L 33/04 (2013.01); Y02E 10/549 (2013.01); Y10S 977/774 (2013.01); Y10S 977/825 (2013.01); Y10S 977/896 (2013.01); Y10S 977/948 (2013.01); Y10S 977/95 (2013.01)

(56) References Cited

U.S. PATENT DOCUMENTS

| | | | |
|---|---|---|---|
| 8,093,494 | B2 | 1/2012 | Gur et al. |
| 8,765,014 | B2 | 7/2014 | Cho et al. |
| 9,093,656 | B2 | 7/2015 | Pan et al. |
| 2008/0014463 | A1 | 1/2008 | Varadarajan et al. |
| 2016/0133463 | A1 | 5/2016 | Luther et al. |

OTHER PUBLICATIONS

Written Opinion of the International Searching Authority from corresponding PCT patent application, PCT/US17/35156, dated Sep. 1, 2017, 7 pages.
Song, J. et al., "Quantum Dot Light-Emitting Diodes Based on Inorganic Perovskite Cesium Lead Halides ($CsPbX_3$)," Advanced Materials, vol. 27, 2015, pp. 7162-7167.
Anderson, N. et al., "Ligand Exchange and the Stoichiometry of Metal Chalcogenide Nanocrystals: Spectroscopic Observation of Facile Metal-Carboxylate Displacement and Binding," Journal of the American Chemical Society, vol. 135, 2013, pp. 18536-18548.
Beal, R. et al., "Cesium Lead Halide Perovskites with Improved Stability for Tandem Solar Cells," Journal of Physical Chemistry Letters, vol. 7, 2016, pp. 746-751.
Boles, M. et al., "The surface science of nanocrystals," Nature Materials, vol. 15, Feb. 2016, pp. 141-153.
Brown, P. et al., "Energy Level Modification in Lead Sulfide Quantum Dot Thin Films through Ligand Exchange," ACS Nano, vol. 8, No. 6, pp. 5863-5872.
Brus, L., "Electron-electron and electron-hole interactions in small semiconductor crystallites: The size dependence of the lowest excited electronic state," Journal of Chemical Physics, vol. 80, No. 9, May 1, 1984, pp. 4403-4409.
Carey, G. et al., "Colloidal Quantum Dot Solar Cells," Chemical Reviews, vol. 115, 2015, pp. 12732-12763.
Chuang, C. et al., "Improved performance and stability in quantum dot solar cells through band alignment engineering," Nature Materials, vol. 13, No. 8, Aug. 2014, pp. 1-13.
Crisp, R. et al., "Metal Halide Solid-State Surface Treatment for High Efficiency PbS and PbSe QD Solar Cells," Scientific Reports, 5:9945, Apr. 24, 2015, pp. 1-6.
Das Tidar, S. et al., "High Chloride Doping Levels Stabilize the Perovskite Phase of Cesium Lead Iodide," ACS NanoLetters, vol. 16, May 2, 2016, pp. 3563-3570.

Debnath, R. et al., "Solution-processed colloidal quantum dot photovoltaics: A perspective," Energy & Environmental Science, vol. 4, 2011, pp. 4870-4811.
Eperon, G. et al., "Inorganic caesium lead iodide perovskite solar cells," Journal of Materials Chemistry A, vol. 3, 2015, pp. 19688-1969.
Evans, C. et al., "Review of the synthesis and properties of colloidal quantum dots: the evolving role of coordinating surface ligands," Journal of Coordination Chemistry, vol. 65, No. 13, Jul. 10, 2012, pp. 2391-2414.
Fafarman, A. et al., "Thiocyanate-Capped Nanocrystal Colloids: Vibrational Reporter of Surface Chemistry and Solution-Based Route to Enhanced Coupling in Nanocrystal Solids," Journal of the American Chemical Society, vol. 133, 2011, pp. 15753-15761.
Frecker, T. et al., "Review—Quantum Dots and Their Application in Lighting, Displays, and Biology," ECS Journal of Solid State Science and Technology, vol. 5, No. 1, 2016, pp. R3019-R3031.
Frederick, M. et al., "Relaxation of Exciton Confinement in CdSe Quantum Dots by Modification with a Conjugated Dithiocarbamate Ligand," ACS Nano, vol. 4, No. 6, pp. 3195-3200.
Giansante, C. et al., "Colloidal Arenethiolate-Capped PbS Quantum Dots: Optoelectronic Properties, Self-Assembly, and Application in Solution-Cast Photovoltaics," Journal of Physical Chemistry, vol. 117, 2013, pp. 13305-13317.
Giansante, C. et al., "'Darker-than-Black' PbS Quantum Dots: Enhancing Optical Absorption of Colloidal Semiconductor Nanocrystals via Short Conjugated Ligands," Journal of the American Chemical Society, vol. 137, 2015, pp. 1875-1886.
Hansch, C. et al., "A Survey of Hammett Substituent Constants and Resonance and Field Parameters," Chemistry Reviews, vol. 91, 1991, pp. 165-195.
Hendricks, M. et al., "A tunable library of substituted thiourea precursors to metal sulfide nanocrystals," Science, vol. 348, Issue 6240, Jun. 12, 2015, pp. 1226-1230.
Jellicoe, T. et al., "Synthesis and Optical Properties of Lead-Free Cesium Tin Halide Perovskite Nanocrystals," Journal of the American Chemical Society, vol. 138, 2016, pp. 2941-2944.
Kovalenko, M. et al., "Colloidal Nanocrystals with Molecular Metal Chalcogenide Surface Ligands," Science, vol. 324, Jun. 12, 2009, pp. 1417-1420.
Kulbak, M. et al., "How Important Is the Organic Part of Lead Halide Perovskite Photovoltaic Cells? Efficient $CsPbBr_3$ Cells," Journal of Physical Chemistry Letters, vol. 6, 2015, pp. 2452-2456.
Lattante, S., "Electron and Hole Transport Layers: Their Use in Inverted Bulk Heterojunction Polymer Solar Cells," Electronics, vol. 3, 2014, pp. 132-164.
Liu, M. et al., "Double-Sided Junctions Enable High-Performance Colloidal-Quantum-Dot Photovoltaics," Advanced Materials, vol. 28, 2016, pp. 4142-4148.
Luther, J. et al., "Multiple Exciton Generation in Films of Electronically Coupled PbSe Quantum Dots," Nano Letters, vol. 7, No. 6, 2007, pp. 1779-1784.
Miller, E. et al., "Revisiting the Valence and Conduction Band Size Dependence of PbS Quantum Dot Thin Films," ACS Nano, vol. 10, 2016, pp. 3302-3311.
Moreels, I. et al., "Composition and Size-Dependent Extinction Coefficient of Colloidal PbSe Quantum Dots," Chemical Materials, vol. 19, Nov. 15, 2007, pp. 6101-6106.
Oh, S. et al., "Stoichiometric Control of Lead Chalcogenide Nanocrystal Solids to Enhance Their Electronic and Optoelectronic Device Performance," ACS Nano, vol. 7, No. 3, 2013, pp. 2413-2421.
Owen, J., The coordination chemistry of nanocrystal surfaces,: Science, vol. 347, Issue 6222, Feb. 6, 2015, pp. 615-616.
Palazon, F. et al., "Polymer-Free Films of Inorganic Halide Perovskite Nanocrystals as UV-to-White Color-Conversion Layers in LEDs," Chemistry of Materials, vol. 28, 2016, pp. 2902-2906.
Peterson, M. et al., "The Role of Ligands in Determining the Exciton Relaxation Dynamics in Semiconductor Quantum Dots," Annual Review of Physical Chemistry, vol. 65, 2014, pp. 317-339.
Protesescu, L. et al., "Nanocrystals of Cesium Lead Halide Perovskites ($CsPbX_3$, X=Cl, Br, and I): Novel Optoelectronic Materials Showing Bright Emission with Wide Color Gamut," NanoLetters, vol. 15, 2015, pp. 3692-3696.

(56) References Cited

OTHER PUBLICATIONS

Reinhart, C. et al., "Colloidally Prepared 3-Mercaptopropionic Acid Capped Lead Sulfide Quantum Dots," Chemistry of Materials, vol. 27, 2015, pp. 7313-7320.
Ripolles, T. et al., "Efficiency enhancement by changing perovskite crystal phase and adding a charge extraction interlayer in organic amine free-perovskite solar cells based on cesium," Solar Energy Materials & Solar Cells, vol. 144, 2016, pp. 532-536.
Santra, P. et al., "Improving Performance in Colloidal Quantum Dot Solar Cells by Tuning Band Alignment through Surface Dipole Moments," Journal of Physical Chemistry, vol. 119, 2015, pp. 2996-3005.
Smith, A. et al., "Effect of Ligand Structure on the Optical and Electronic Properties of Nanocrystalline PbSe Films," Journal of Physical Chemistry, vol. 116, 2012, pp. 6031-6037.
Sun, S. et al., "Ligand-Mediated Synthesis of Shape-Controlled Cesium Lead Halide Perovskite Nanocrystals via Reprecipitation Process at Room Temperature," ACS Nano, vol. 10, 2016, pp. 3648-3657.
Sutton, R. et al., "Bandgap-Tunable Cesium Lead Halide Perovskites with High Thermal Stability for Efficient Solar Cells," Materials Views, vol. 6, 2016, 1502458, 6 pages.
Talapin, D. et al., "PbSe Nanocrystal Solids for n- and p-Channel Thin Film Field-Effect Transistors," Science, vol. 310, Oct. 7, 2005, pp. 86-89.
Valizadeh, A., "Quantum dots: synthesis, bioapplications, and toxicity," Nanoscale Research Letters, vol. 7:480, 2012, 14 pages.
Yang, S. et al., "Tuning Semiconductor Band Edge Energies for Solar Photocatalysis via Surface Ligand Passivation," Nano Letters, vol. 12, 2012, pp. 383-388.
Zarghami, M. et al., "p-Type PbSe and PbS Quantum Dot Solids Prepared with Short-Chain Acids and Diacids," ACS Nano, vol. 4, No. 4, 2010, pp. 2475-2485.

NANOPARTICLES FOR PHOTOVOLTAIC AND LED DEVICES AND METHODS OF MAKING THE SAME

CROSS-REFERENCE TO RELATED APPLICATIONS

This application claims the benefit of U.S. Provisional Application Nos. 62/343,251 and 62/464,946 filed May 31, 2016 and Feb. 28, 2017, respectively, the contents of which are incorporated herein by reference in their entirety.

CONTRACTUAL ORIGIN

This invention was made with Government support under Grant No. DE-AC36-08GO28308 awarded by the U.S. Department of Energy, and Grant No. NNX13AL60H awarded by the National Aeronautics and Space Administration (NASA). The Government has certain rights in the invention.

BACKGROUND

Halide perovskites have resulted in breakthrough performances in optoelectronic applications such as solar cells, and light emitters. The prototypical perovskite material for photovoltaics (PVs) (first applied to PV in 2009) is $CH_3NH_3PbI_3$. In only seven years of research, perovskite PV devices processed cheaply from solution inks have now been verified to convert >22% of incident sunlight into electricity, on par with the best thin film chalcogenide devices and silicon devices. One major hurdle in the commercialization of this technology lies in the long-term stability and durability of the semiconductor. Under environmental stresses, the compound can easily dissociate into $PbI_2$ and $CH_3NH_3I$, the latter of which is volatile.

Thus, there remains a need for new perovskite materials that can provide improved durability and sustained long-term performance for solar and light-emitting diode (LED) applications.

SUMMARY

An aspect of the present disclosure is a composition that includes a particle and a surface species, where the particle has a characteristic length between greater than zero nm and 100 nm inclusively, and the surface species is associated with a surface of the particle such that the particle maintains a crystalline form when the composition is at a temperature between −180° C. and 150° C. In some embodiments of the present disclosure, the particle may include at least one of a metal chalcogenide, a Group III-V material, a metal oxide, and/or a perovskite. In some embodiments of the present disclosure, the particle may include the perovskite comprising at least one of $CsPbI_3$, $CsPbBr_3$, $CsPbCl_3$, $RbPbI_3$, $RbPbBr_3$, and/or $RbPbCl_3$. In some embodiments of the present disclosure, the crystalline form may be substantially cubic.

In some embodiments of the present disclosure, the surface species may be associated with the surface of the particle by at least one of a covalent bond, an ionic bond, van der Waals interactions, dipole-dipole interactions, Debye interactions, and/or hydrogen-bonding. In some embodiments of the present disclosure, the surface species may be associated with the surface of the particle by at least one ionic bond. In some embodiments of the present disclosure, the surface species may include at least one of a saturated hydrocarbon, an unsaturated hydrocarbon, a thiol-containing molecule, an acid, and/or a metal halide. In some embodiments of the present disclosure, the surface species may include at least one of oleate and/or oleylammonium. In some embodiments of the present disclosure, a metal of the metal halide may include at least one of lead, germanium, and/or tin. In some embodiments of the present disclosure, the metal halide may include at least one of $PbI_2$, $PbBr_2$, $PbCl_2$, $GeI_2$, $GeBr_2$, $GeCl_2$, $SnI_2$, $SnBr_2$, and/or $SnCl_2$.

In some embodiments of the present disclosure, the composition may further include an organic cation (A) associated with the surface of the particle. In some embodiments of the present disclosure, A may include at least one of methylammonium (MA) and/or formamidinium (FA).

An aspect of the present disclosure is a device that includes an active layer that includes a particle and a surface species, where the particle has a characteristic length between greater than zero nm and 100 nm inclusively, and the surface species is associated with a surface of the particle such that the particle maintains a crystalline form when the device is at a temperature between −180° C. and 150° C. In some embodiments of the present disclosure, the particle may be a perovskite that includes at least one of $CsPbI_3$, $CsPbBr_3$, $CsPbCl_3$, $RbPbI_3$, $RbPbBr_3$, and/or $RbPbCl_3$. In some embodiments of the present disclosure, the crystalline form may be substantially cubic.

An aspect of the present disclosure is a method that includes dispersing a first surface species and a particle in a mixture that includes an alkyl acetate, where the first surface species is associated with a surface of the particle, the particle has characteristic length between greater than 0 nm and 100 nm, the dispersing removes a first portion of the first surface species from the surface, the particle has a first crystalline form before the dispersing and a second crystalline form after the dispersing, and the second crystalline form is maintained, after the dispersing, when the particle is at a temperature between −180° C. and 150° C.

In some embodiments of the present disclosure, the particle may include at least one of a metal chalcogenide, a Group III-V material, a metal oxide, and/or a perovskite. In some embodiments of the present disclosure, the particle may include a perovskite that includes at least one of $CsPbX_3$, $RbPbX_3$, $CsGeX_3$, $RbGeX_3$, $CsSnX_3$, and/or $RbSnX_3$, and X is a halogen. In some embodiments of the present disclosure, the second crystalline form may be substantially cubic. In some embodiments of the present disclosure, the first surface species may include at least one of a saturated hydrocarbon, an unsaturated hydrocarbon, a thiol-containing molecule, an acid, and/or a metal halide.

In some embodiments of the present disclosure, the first portion may be less than 100% of the first surface species and a remainder of the first surface species may remain associated with the surface of the particle, after the dispersing. In some embodiments of the present disclosure, the alkyl acetate may include at least one of ethyl acetate, methyl acetate, propyl acetate, and/or butyl acetate. In some embodiments of the present disclosure, the mixture may further include at least one of acetate ester, acetone, acetonitrile, diethyl ether, and/or propylene carbonate.

In some embodiments of the present disclosure, the mixture may further include a first salt that includes at least one of an acetate, a nitrate, a carbonate, a thiocyanate, and/or a phosphate, and a metal that includes at least one of lead, germanium and/or tin, the dispersing may result in the first salt forming a second surface modifier that includes the metal and the halogen, the first portion may be substantially 100% of the first surface modifier, at least a fraction of the second modifier may associate with the surface of the particle, and the second crystalline form is maintained when the particle is at a temperature between −180° C. and 150° C. In some embodiments of the present disclosure, the second modifier may include a metal halide. In some embodiments of the present disclosure, the method may further include, after the dispersing, contacting the particle with a solution that includes an aprotic solvent and a second salt, resulting in the forming of a third surface species that associates with the surface of the particle.

BRIEF DESCRIPTION OF THE DRAWINGS

Exemplary embodiments are illustrated in referenced figures of the drawings. It is intended that the embodiments and figures disclosed herein are to be considered illustrative rather than limiting.

(FIG. 5A) ultra-violet (UV)-visible absorption spectra and photographs of suspensions of $CsPbI_3$ NPs synthesized at (a) 60 (3.4 nm), (b) 100° C. (4.5 nm), (c) 130° C. (5 nm), (d) 150° C. (6.8 nm), (e) 170° C. (8 nm), (f) 180° C. (9 nm), (g) 185° C. (12.5 nm), average size (measured via transmission electron microscopy analysis) shown in parentheses. (FIG. 5B) Normalized photoluminescence spectra and photographs under UV illumination of the NPs from FIG. 5A. (FIG. 5C) High resolution transmission electron micrograph of $CsPbI_3$ NPs synthesized at 180° C. (FIG. 5D) x-ray diffraction (XRD) patterns of NPs synthesized at (a) 60° C., (b) 100° C., (e) 170° C., (f) 180° C., and (g) 185° C. NPs confirming that they crystallize in the cubic phase of $CsPbI_3$.

(FIG. 9A) XRD patterns (day 60—dashed line; day 1—solid line) and (FIG. 9B) UV-Visible absorption spectra, normalized at 370 nm, of $CsPbI_3$ NPs synthesized at 170° C. and stored in ambient conditions for a period of 1 day (solid line), 30 days (long dashes), and 60 days (short dashes). (FIG. 9C) Rietveld refinement of $CsPbI_3$ NP XRD pattern revealing pure cubic phase $CsPbI_3$ (experimental data—squares; simulated data—solid line). Inset in FIG. 9B shows the slight blue shift, which is seen in the excitonic peak with extended storage.

(FIG. 10A) UV-visible absorption (solid lines) and PL spectra (dashed lines) of $CsPbI_3$ NPs in solution (thicker lines) and cast as films (thinner lines) for NPs synthesized at 100, 150, and 180° C. (FIG. 10B) Fourier-transform infrared (FTIR) spectra showing the infrared (IR) transmission of a $CsPbI_3$ NP film as cast (solid line), after washing with MeOAc (dashed line).

(FIG. 11C) Photoluminescence of a NP film before (solid line) and after dip-coating in saturated $Pb(OAc)_2$ (dashed line).

(FIG. 12A) Schematic (with high-resolution transmitting electron microscopy (HRTEM) image of NPs) and scanning electron microscopy (SEM) cross-section of the $CsPbI_3$ solar cells. (FIG. 12B) Current-voltage curves of a device measured in air over the course of 1 day (short dashes), 9 days (long dashes), and 15 days (solid line); $Eff_{AM\ 1.5G}$=10.77%, $V_{OC}$=1.23 V, $J_{SC}$=13.47 mmA/cm$^2$, FF=0.650. The diamond represents the stabilized output of the device at 0.92 V, as shown in FIG. 13. (FIG. 12C) External quantum efficiency (left ordinate) and integrated current density (right ordinate) of the device. (FIG. 12D) electroluminescence (EL) spectra of $CsPbI_3$ solar cell ($CsPbI_3$ synthesized at 170° C.) under forward bias. The inset shows a photograph of the luminescent device. (FIG. 12E) PL (dashed lines) and EL (solid lines) spectra of completed devices fabricated using $CsPbI_3$ NPs synthesized at 170 (top data set) and 180° C. (bottom data set) demonstrating size quantization effects in the completed devices.

REFERENCE NUMBERS

| | |
|---|---|
| 100 | starting nanoparticle |
| 105 | treatment |
| 110 | first surface species |
| 120 | solid core |
| 130 | modified nanoparticle |
| 140 | second surface species |
| 200, 300 | method |
| 210, 310 | synthesizing |
| 220 | pre-treating |
| 230, 330 | applying |
| 240, 340 | modifying |
| 250 | post-treating |
| 260, 360 | decision step |
| 305 | precursor synthesizing |
| 320A | precipitating |
| 320B | suspending |
| 350 | drying |
| 400 | device |
| 410 | substrate |
| 420 | first current collector |
| 430 | electron-transport layer |
| 440 | active layer |
| 450 | hole-transport layer |
| 460 | $MoO_x$ layer |
| 470 | second current collector |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure relates to synthetic routes to produce nanoparticles (NPs), such as $CsPbI_3$ nanoparticles. Experimental results presented herein demonstrate that, once purified, $CsPbI_3$ NPs made by methods described herein, easily retain a cubic phase in ambient air and even at cryogenic temperatures (e.g. less than 180° C.), as well as at elevated temperatures up to at least 150° C. Methods described herein are capable of forming $CsPbI_3$ perovskite films that are capable of long-range electronic transport between perovskite NPs (where "long-range" corresponds to charge transport through multiple nanoparticles corresponding to distances up to 100 nm, 200 nm, 300 nm, 400 nm, and/or 500 nm or greater). These $CsPbI_3$ films resulted in colloidal $CsPbI_3$ perovskite nanoparticle solar cell devices capable of long-term stability over a wide range of temperatures and environmental conditions, where the term "colloidal" refers to the dispersion and/or suspension of NPs in a liquid, rather than dissolving NPs into dissolved ions. These $CsPbI_3$ devices demonstrated excellent performance metrics, including high efficiencies and stabilized power outputs, producing up to 1.23 V at open circuit. $CsPbI_3$ perovskite nanoparticle devices were also shown to function as light-emitting diodes (LEDs), emitting visible light in the red-region of the optoelectronic spectrum, with low turn-on voltages (e.g. between 1.4 volts and 1.5 volts for a bandgap energy of about 1.7 eV) when forward biased.

Figure 1:
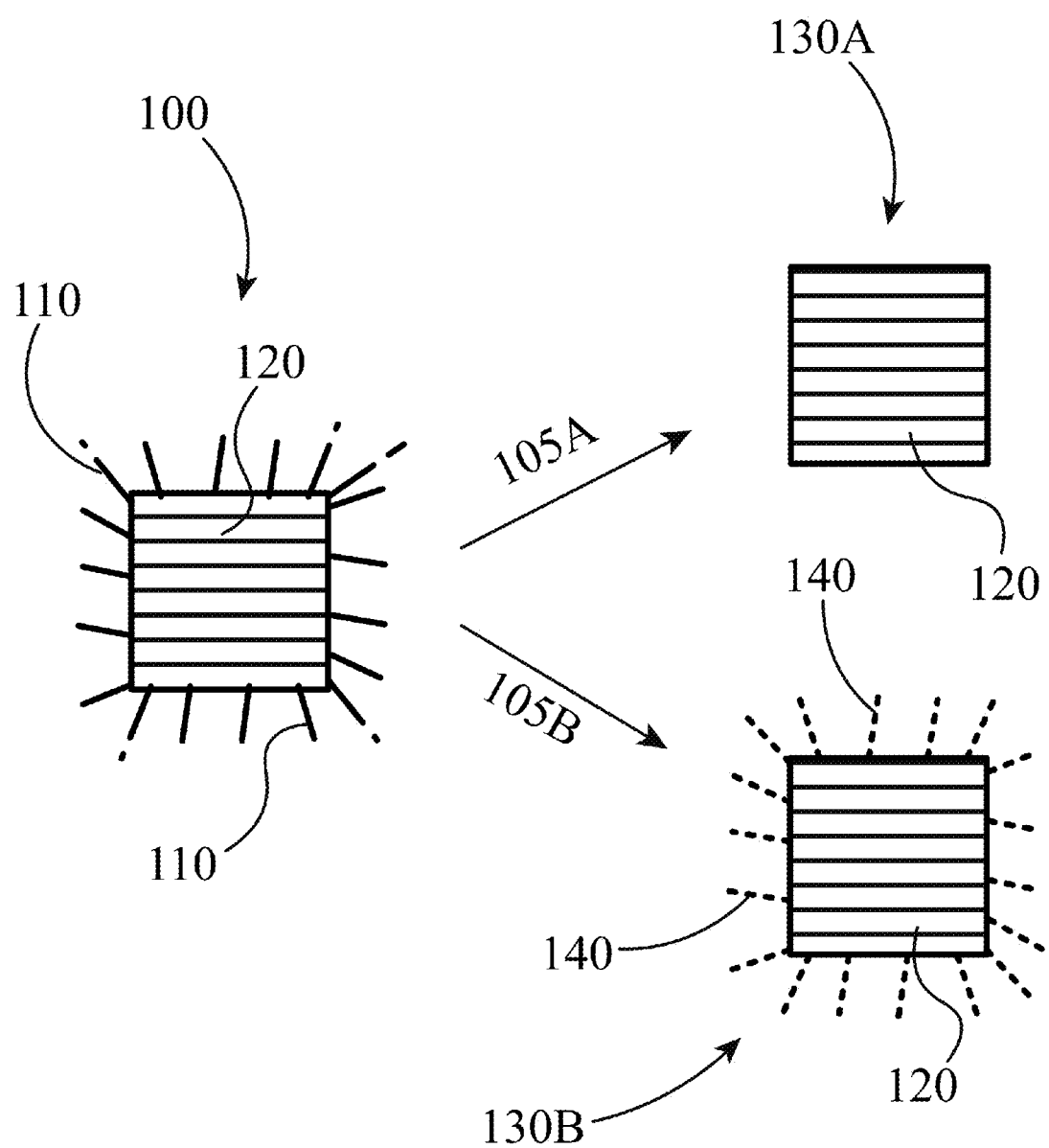
FIGS. 1-3 illustrate methods for modifying a starting nanoparticle to produce a modified nanoparticle, according to embodiments of the present disclosure.

FIG. 1 illustrates a starting nanoparticle 100 having a solid core 120 and a first surface modifier 110 associated with a surface of the solid core 120. FIG. 1 illustrates two different routes (e.g. treatments, 105A, 105B) that modify at least one physical and/or performance metric of the starting nanoparticle 100, resulting in modified nanoparticles (130A and 130B) having at least on physical property and/or performance metric that is different than those of the starting nanoparticle 100. For example, treating the starting nanoparticle 100 by treatment 105A may remove at least a portion of the first surface modifier 110 from a surface of the solid core 120 of the starting nanoparticle 100, resulting in a modified nanoparticle 130A. Treatment 105B illustrates another example that may transform the starting nanoparticle 100 to a modified nanoparticle 130B by removing at least a portion of the first surface modifier 110 from the surface of the solid core 120 and replacing at least portion of the first surface modifier 110 with a second surface modifier 140, resulting in the modified nanoparticle 130B. Thus, some of the treatments (e.g. 105A) described herein may remove at least a portion of a first surface modifier 110 (e.g. organic ligands and/or inorganic ligands) associated with the external surfaces of a solid core 120 (e.g. semiconductor material) of a starting nanoparticle 100, resulting in a modified nanoparticle 130A having a solid core 120 that is substantially free of the first surface modifier 110 or any other surface modifier, compound, and/or element associated with its surface. In addition, some treatments (e.g. 105B) may not only remove a first surface modifier 110, but also replace at least a portion of the first surface modifier 110 (e.g. organic ligands and/or inorganic ligands) with a second surface modifier 140 (e.g. organic ligands and/or inorganic ligands).

In some embodiments of the present disclosure, removal of a first surface modifier 110 from the surface of a solid core 120 of a starting nanoparticle 100 and/or removal of the first surface modifier 110 and/or the replacement of the first surface modifier 110 by a second surface modifier 140 may change the solid core 120 such as at least one physical property of the solid core 120. In some embodiments of the present disclosure, removal of a first surface modifier 110 from a solid core 120 of a starting nanoparticle 100 and/or removal of the first surface modifier 110 and/or the replacement of the first surface modifier 110 by a second surface modifier 140 may change the solid core 120 such as least one optoelectronic property of the solid core 120, for example a bandgap, a emission spectra, a nanoparticle density, nanoparticle ordering, electron mobility, electron conductivity, photoluminescence quantum yield, and/or trap state density of the nanoparticles and/or nanoparticle film. Thus, some of the embodiments described herein, provide methods for treating a starting nanoparticle film having a starting set of physical and/or optoelectronic properties, resulting in a modified nanoparticle film having a second set of physical and/or optoelectronic properties that are different than the starting set. Some of the methods described herein, may transfer starting nanoparticles (e.g. from an intermediate solution) to a solid film in a final target device, such that the transfer of the starting nanoparticles modifies at least one physical and/or optoelectronic property of the starting nanoparticles, resulting in modified nanoparticles having at least one improved physical and/or optoelectronic property. In some embodiments, methods may transfer starting nanoparticles (e.g. from an intermediate solution) to a solid film in a final target device, where the final physical and/or optoelectronic properties of the nanoparticles in the solid film are substantially the same as the properties of the starting nanoparticles.

The solid core 120 of the starting nanoparticle 100 and/or the modified nanoparticle 130 may be crystalline, amorphous, or a combination thereof. Thus, when the solid core 120 is in a crystalline form, a "nanoparticle" may be referred to as a "nanocrystal" or "quantum dot". When crystalline, the crystalline phase of a nanoparticle may be cubic, hexagonal, tetragonal, rhombohedral, orthorhombic, monoclinic, and/or triclinic. A nanoparticle may have a characteristic length that is between about 1 nm to about 100 nm, or in some embodiments between about 1 nm and about 20 nm. A solid core 120 may include one or more metal chalcogenides including at least one of PbS, PbSe, PbTe, CdSe, CdS, CdTe, CuInS, CuInSe, ZnS, ZnSe, ZnTe, HgTe, and/or CdHgTe. In some embodiments, a solid core 120 may include one or more IUPAC Group III-V materials including InP, InAs, GaAs Si, Ge, SiGe, and/or Sn. In some embodiments, the material used in a solid core 120 may include at least one of ZnO, MoO, $TiO_2$, and/or any other suitable metal oxides. A solid core 120 may be any solid crystalline material, including $CsPbI_3$, $CsPbBr_3$, $CsPbCl_3$, $RbPbI_3$, $RbPbBr_3$, and/or $RbPbCl_3$. Thus, a solid core 120 may include the combination of a Group 1 element (e.g. Na, K, Rb, and/or Cs), a Group 14 element (e.g. Si, Ge, Sn, and/or Pb) and/or a halogen (e.g. F, Cl, Br, I, and/or At). A solid core 120 may also include one or more perovskite oxides and/or perovskite chalcogenides with examples including $BaTiO_3$, $CaTiO_3$, $BaTiS_3$, BaTiSe3 and/or any other suitable material or alloy. Thus, a solid core 120 may include at least one of an oxide perovskite, a chalcogenide perovskite, and/or a halide perovskite.

FIG. 1 shows that a starting nanoparticle 100 may have a first surface modifier 110 associated with an external surface of the solid core 120. Similarly, a modified nanoparticle 130B may have a second surface modifier 140 associated with an external surface of the solid core 120. Examples of a surface modifier (first surface modifier 120 and/or second surface modifier 140) include saturated hydrocarbons, unsaturated hydrocarbons, thiol-containing molecules, amines, alkylamines, carboxylates, carboxylic acids, and/or acids. Examples of thiol-containing molecules suitable for embodiments of the present disclosure include methanethiol, ethanethiol, ethanedithiol, 1-propanethiol, propanedithiol, butanedithiol, octanethiol, and/or any other suitable thiol- and/or dithiol-containing molecule. Examples of acid surface modifiers include oleic acid, stearic acid, acetic acid, formic acid, oxalic acid, perfluorotetradecanoic acid, tetradecylphosphonic acid, and/or mercaptoprorionic acid. Other examples of surface modifiers include oleate, perfluorocyclobutane, octadecylamine, poly(vinyl butyral-covinyl alcohol-covinyl acetate), trioctylphosphine, trioctylphosphine dioxide, pyridine, thiocresol, oleylamine, benzoquinone. First surface modifiers 120 and second surface modifiers 140 may associate with a surface of a solid core 120 covalently, ionically, by van der Waals interactions, by dipole-dipole interactions, by Debye interactions, and/or by hydrogen-bonding. Examples of covalent bonding include X-type binding, L-type binding, and/or Z-type binding. In some embodiments of the present disclosure, for example for the cases where a surface modifier is at least one of oleate, oleylammonium, and/or a metal halide, the surface modifier associates with a surface of the particle by ionic interactions.

Figure 2:
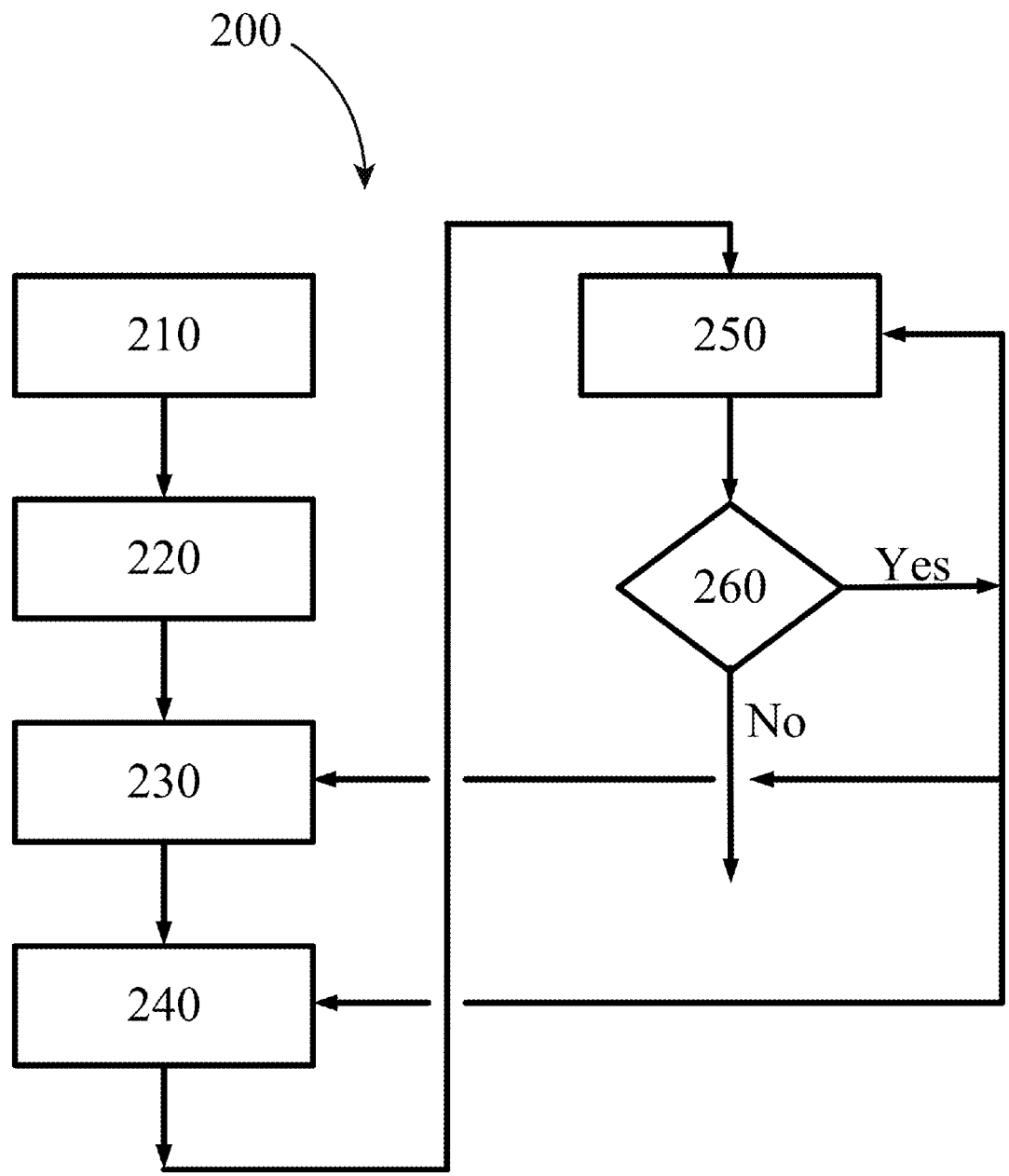

FIG. 2 illustrates an example of a method 200, for converting a starting nanoparticle into a modified nanoparticle. This example method 200 begins with NP synthesizing 210, either to produce a NP precursor and/or a final NP product. Such methods for NP synthesizing 210 may include molecular beam epitaxy (MBE), ion implantation, e-beam lithography, x-ray lithography, wet-chemical solution processing, and/or vapor-phase processing. Wet-chemical solution processing may include precipitation methods that involve nucleation and growth of the nanoparticles. Nucleation processes may be homogeneous, heterogeneous, and/or secondary nucleation. Homogeneous nucleation occurs when solute atoms or molecules combine and reach a critical size without the assistance of a pre-existing solid interface. Wet-chemical methods may include hot-injection, microemulsion, sol-gel, competitive reaction chemistry, hot-solution decomposition, sonic waves, microwaves, and/or electrochemistry. Vapor phase processing may include at least one of MBE, sputtering, liquid metal ion sources, and/or aggregation of gaseous monomers. NP synthesizing 210 may be a colloidal method resulting in a colloidal starting nanoparticle and/or quantum dot. In some embodiments of the present disclosure, NP synthesizing 210 to produce starting nanoparticles may include arrested precipitation, templated growth, organometallic synthesis, organic surface modifiers (e.g. ligands), inorganic surface modifiers (e.g. ligands), and/or any other suitable technique (see *Journal of Coordination Chemistry* Vol. 65, No. 13, 2012, 2391-2414, which is incorporated herein by reference in its entirety)

Referring again to FIG. 2, example method 200 for manufacturing nanoparticles and for transferring the nanoparticles to a photovoltaic and/or LED device may include, after completion of nanoparticle synthesizing 210, nanoparticle pretreating 220, which may include one or more processing steps that treat the starting nanoparticles; e.g. precipitating, separating, purifying, and/or creating a solution containing the starting nanoparticles. For example, nanoparticle pretreating 220 may include adding starting nanoparticles to a carrier solvent in which the starting nanoparticles do not completely dissolve and stay substantially in the solid phase, resulting in the formation of a storage/delivery solution of the starting nanoparticles. Such a storage/delivery solution may then facilitate nanoparticle applying 230 in a subsequent processing step, for example, application of the starting nanoparticles to a device substrate, such as glass, by any suitable solution processing method; e.g. dip-coating, spin-coating, curtain-coating, etc. Thus, nanoparticle applying 230 may result in a layer, coating, and/or film of a solution containing the starting nanoparticles on a substrate. The nanoparticle applying 230 may be followed by a nanoparticle modifying 240 step. Nanoparticle modifying 240, as illustrated in FIG. 1, may modify a starting nanoparticle 100, resulting in a modified nanoparticle (130A and 130B). Examples of nanoparticle modifying 240 include removal of at least a portion of a first surface modifier 110 from a surface of a solid core 120 of a starting nanoparticle 100 and/or replacement of at least a portion of the first surface modifier 110 with a second surface modifier 140. Thus, in some embodiments of the present invention, nanoparticle modifying 240 may be accomplished by submerging a substrate having a coating of a solution containing the starting nanoparticles into different solution, such that the submerging results in the removal of at least a portion of a first surface modifier and/or the replacement of at least a portion of the first surface modifier with a second surface modifier to produce the modified nanoparticles. In some embodiments of the present invention, nanoparticle modifying 240 may be accomplished by spraying a modifying solution onto a coating of the solution containing the starting nanoparticles, such that the spraying contacts the solution containing the starting nanoparticles with the modifying solution, which may result in the removal of at least a portion of a first surface modifier and/or the replacement of at least a portion of the first surface modifier with a second surface modifier to produce the modified nanoparticles. The nanoparticle modifying 240 may result in a change to at least one physical property of the individual nanoparticle or the collective properties of a film of the nanoparticles, including optical, electrical, and/or magnetic properties, and/or performance metric of the nanoparticles, such that the modified nanoparticles have at least one physical property, and/or performance metric that is different from those of the starting nanoparticles. As a device having a coating or film of the starting nanoparticles may be treated by a nanoparticle modifying 240 step, nanoparticle modifying 240 may result in a modified film containing modified nanoparticles such that the modified film has significantly different properties than the starting film.

FIG. 2 illustrates that the method 200 may include a nanoparticle post-treating step 250. For example, post-treating 250 may include removal of a component from the modified film containing modified nanoparticles; e.g. a carrier solvent, at least a portion of a modifying solution, etc. Other examples of post-treating 250 include drying and/or annealing. In some embodiments of the present disclosure, the post-treating 250 may result in a film of modified nanoparticles in the final form desired for the device being fabricated; e.g. photovoltaic device or LED. In some embodiments of the present disclosure, post-treating 250 may include vapor annealing. Finally, FIG. 2 illustrates that one or more of the NP applying 230, NP modifying 240, and/or the NP post-treating may be repeated one or more times, for example, to apply additional layers of modified nanoparticles to the device to build thickness and/or provide varying nanoparticles with different behavior, performance, and/or properties. Thus, decision step 260 may result in any of the upstream steps being repeated one or more times, depending on the application and/or the final device operating requirements.

Figure 3:
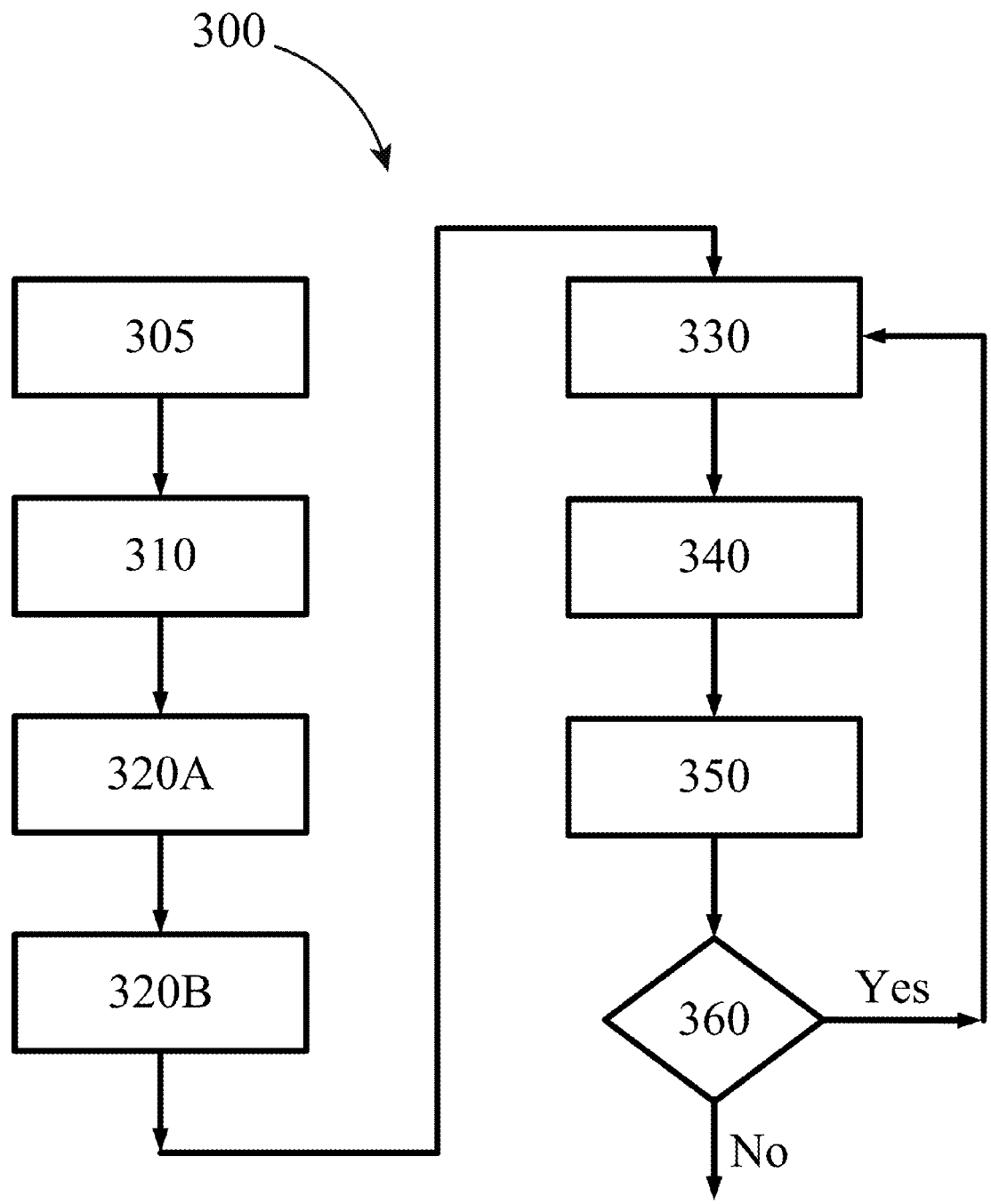

FIG. 3 illustrates an example of a method 300, according to some embodiments of the present disclosure, for manufacturing a film of modified nanoparticles. In this example, the method 300 may begin with a precursor synthesizing step 305 for synthesizing cesium-oleate as a cesium precursor. The precursor synthesizing 305 may be followed by a nanoparticle synthesizing step 310, for example, the synthesis of colloidal $CsPbI_3$ starting nanoparticles. For this example, a solution of $PbI_2$ may be created by combining $PbI_2$ with 1-octadecene, oleic acid, and oleylamine, such that the cesium-oleate precursor may be rapidly injected. The method 300 may then proceed with a nanoparticle precipitating step 320A, where anhydrous methyl acetate (MeOAc) may be added to the solution resulting from the nanoparticle synthesizing 310, which may result in the precipitation of the $CsPbI_3$ starting nanoparticles from the synthesis solution. Next, the precipitated $CsPbI_3$ starting nanoparticles may be suspended in hexane and/or octane in a nanoparticle suspending step 320B. A nanoparticle applying step 330 may follow, which may be accomplished by spin-coating the starting nanoparticles suspended in the hexane and/or octane solution onto a substrate. After the nanoparticle applying 330, the resulting coating of the starting nanoparticle-containing hexane and/or octane solvent may be immediately (e.g. within 1 second to 10 seconds) submerged (e.g. dipped), at least once, into a modifying solution in a starting nanoparticle modifying step 340. The modifying solution may be a substantially saturated solution of at least one of $PbO(Ac)_2$, $Pb(SCN)_2$, and/or $Pb(NO_3)_2$ in anhydrous MeOAc. The method 300 may conclude with a rinsing step (not shown) using anhydrous MeOAc, followed by drying 350 by evaporation, which may result in a solid film containing modified nanoparticles. Method 300 shows that at least one of the steps, nanoparticle applying 330, the nanoparticle modifying 340, and/or the drying 350, may be repeated at least one time, for example to increase the film thickness of modified nanoparticles on the device being fabricated. Thus, decision step 360 may result in any of the upstream steps being repeated one or more times, depending on the application and/or the final device operating requirements.

In some embodiments of the present disclosure, a film of modified nanoparticles may be treated with an AX post-treatment, where X is at least one halogen, and A is a cation with examples include formamidinium ($FA^+$), methyl ammonium ($MA^+$), $Cs^+$, or $Rb^+$. For example, as demonstrated herein, a significant increase in carrier mobility in a film of $CsPbI_3$ nanoparticles may be achieved by such an AX post-treatment, enabling increased photocurrent and a power conversion efficiency (PCE) of 13.4%, presumably by improving the electronic coupling between the nanoparticles, resulting in enhanced carrier mobility in the nanoparticle film.

Figure 4:
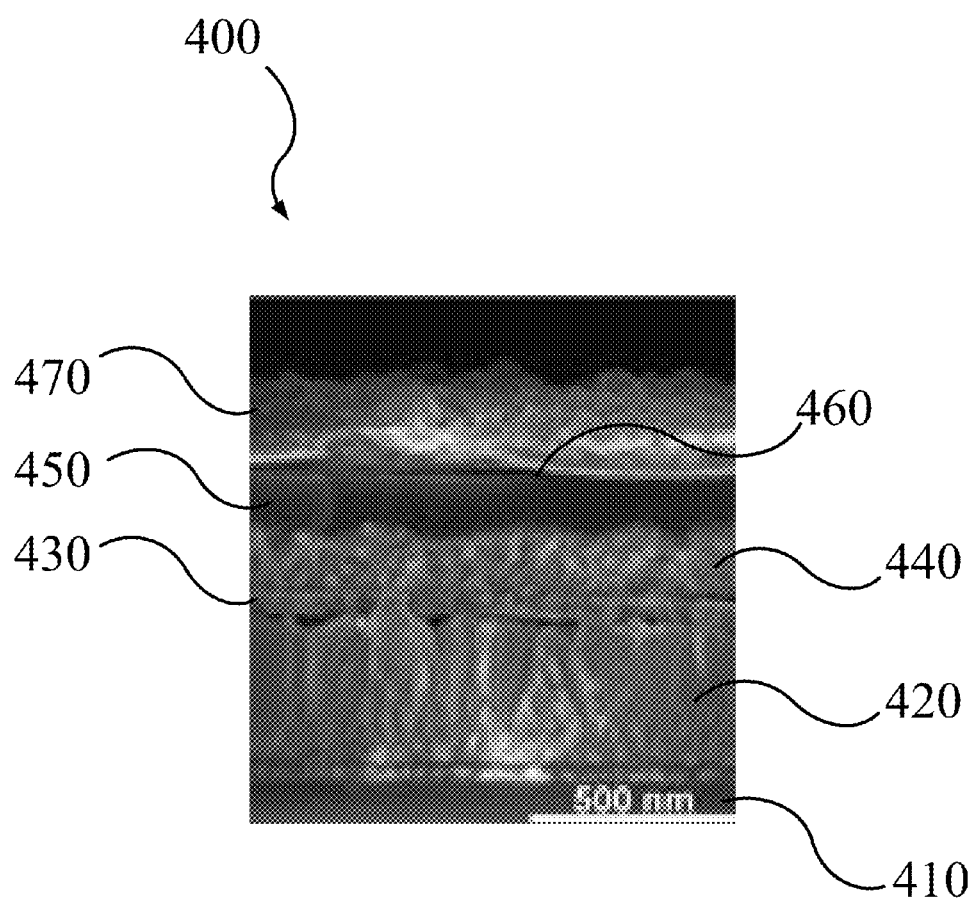
FIG. 4 illustrates a device using an active layer constructed of modified nanoparticles, according to embodiments of the present disclosure.

FIG. 4 illustrates a device 400 having a modified nanoparticle-containing active layer 440, which was deposited using methods described herein. In this example, the nanoparticle-containing active layer 440 contains modified $CsPbI_3$ nanoparticles having a crystalline cubic crystallographic phase, where a first surface modifier of oleylamine/olylammonium and oleic acid/oleate has been substantially removed and at least partially replaced with $PbI_2$, accomplished by submerging a starting film containing stabilizing oleylamine/oleylammonium and oleic acid/oleate groups into a solution of MeOAc saturated with $Pb(OAc)_2 \cdot 3H_2O$ or $Pb(NO_3)_2$. The device 400 also includes a substrate 410, in this example a glass substrate, a first current collector 420, in this example a layer of fluorine-doped tin(IV) oxide. The device 400 also includes an electron-transport layer 430 and a hole-transport layer 450, with the nanoparticle-containing active layer 440 sandwiched between the electron-transport layer 430 and the hole-transport layer 450. In the example shown in FIG. 4, the electron-transport layer 430 was constructed of $TiO_2$, and the hole-transport layer 450 was constructed of spiro-OMeTAD. Further, the device 400 includes a second current collector 470, in this case constructed of aluminum. FIG. 4 also shows that a $MoO_x$ layer 460 may be positioned between the second current collector 470 and the hole-transport layer 450, which may improve the performance of the second current collector 470. In summary, a device 400 may include in order, a substrate 410 in electrical contact with a first current collector 420, an electron-transport layer 430, an active layer 440, a hole-transport layer 450, a $MoO_x$ layer 460, and a second current collector 470.

In some embodiments of the present disclosure, a device 400 may have a substrate 410 constructed of glass, plastic, and/or metal. A device 400 may have a first current collector 420 constructed of one or more transparent conducting films including indium(III) tin(IV) oxide, fluorine-doped tin(IV)

oxide, zinc oxide, organic films, and/or polymers. Examples of organic films that may be used as a first current collector 420 include carbon nanotube networks and/or graphene. Examples of transparent conducting polymers that may be used as a first current collector 420 include poly(3,4-ethylenedioxythiophene) (PEDOT), PEDOT combined with poly (styrene sulfonate) (PSS), Poly(4,4-dioctylcyclopentadithiophene), and/or any other suitable derivatives of polyacetylene, polyaniline, polypyrrole and/or polythiophenes. A device may have an electron-transport layer 430 constructed of at least one of PEDOT, PSS, zinc oxide, tin(IV) oxide, poly(2-(dimethylamino)ethylmethacrylate), $Cs_2CO_3$, $Nb_2O_5$, amino-functionalized conjugated metallopolymers, and/or CdS/2,9-dimethyl-4,7-diphenyl-1,10-phenanthroline. A device may have a hole-transport layer 450 constructed of at least one of PEDOT, PSS, $MoO_3$, $V_2O_5$, $WO_3$, NiO, and/or other metal oxides. A device may have a second current collector 470 constructed of a thin layer of metal such as aluminum, calcium/aluminum, LiF/aluminum, silver, and/or gold. Any other suitable electron-transport material and/or hole-transport material may be used in embodiments of the present disclosure (see *Electronics* 2014, 3, 132-164, which is incorporated herein by reference in its entirety).

EXAMPLES

Figure 5A:
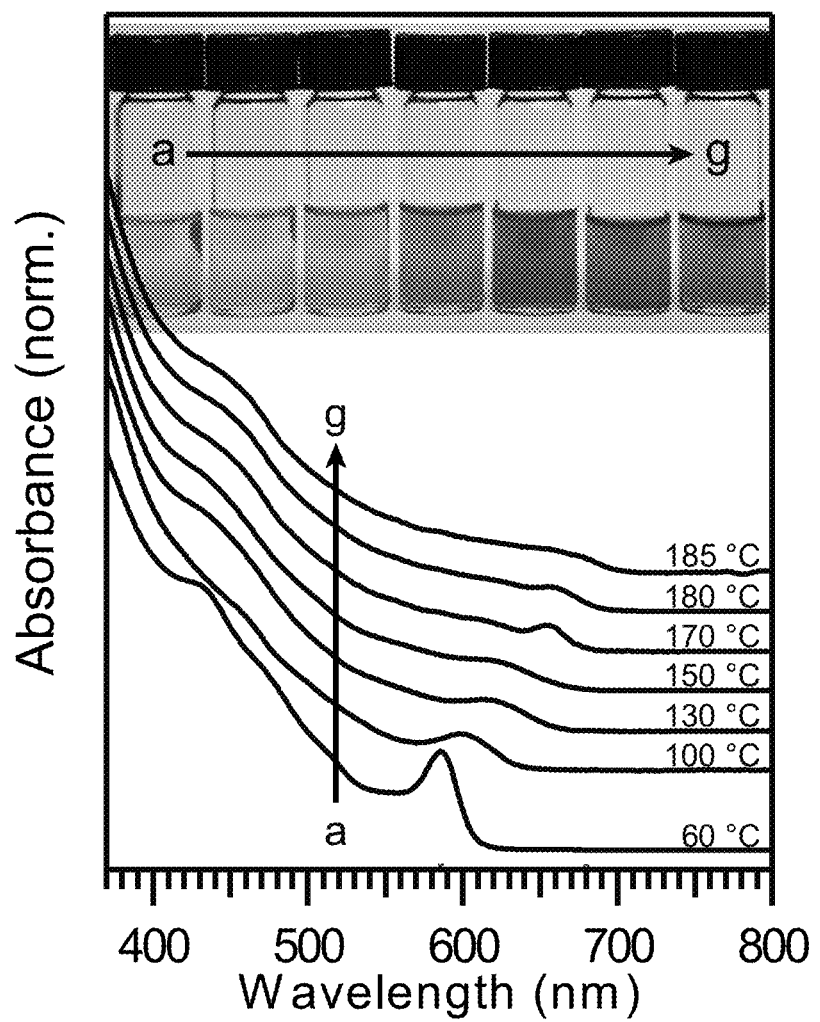
FIGS. 5A-5D summarize performance data of $CsPbI_3$ nanoparticles (NPs) produced according to embodiments of the present disclosure.
Figure 5B:
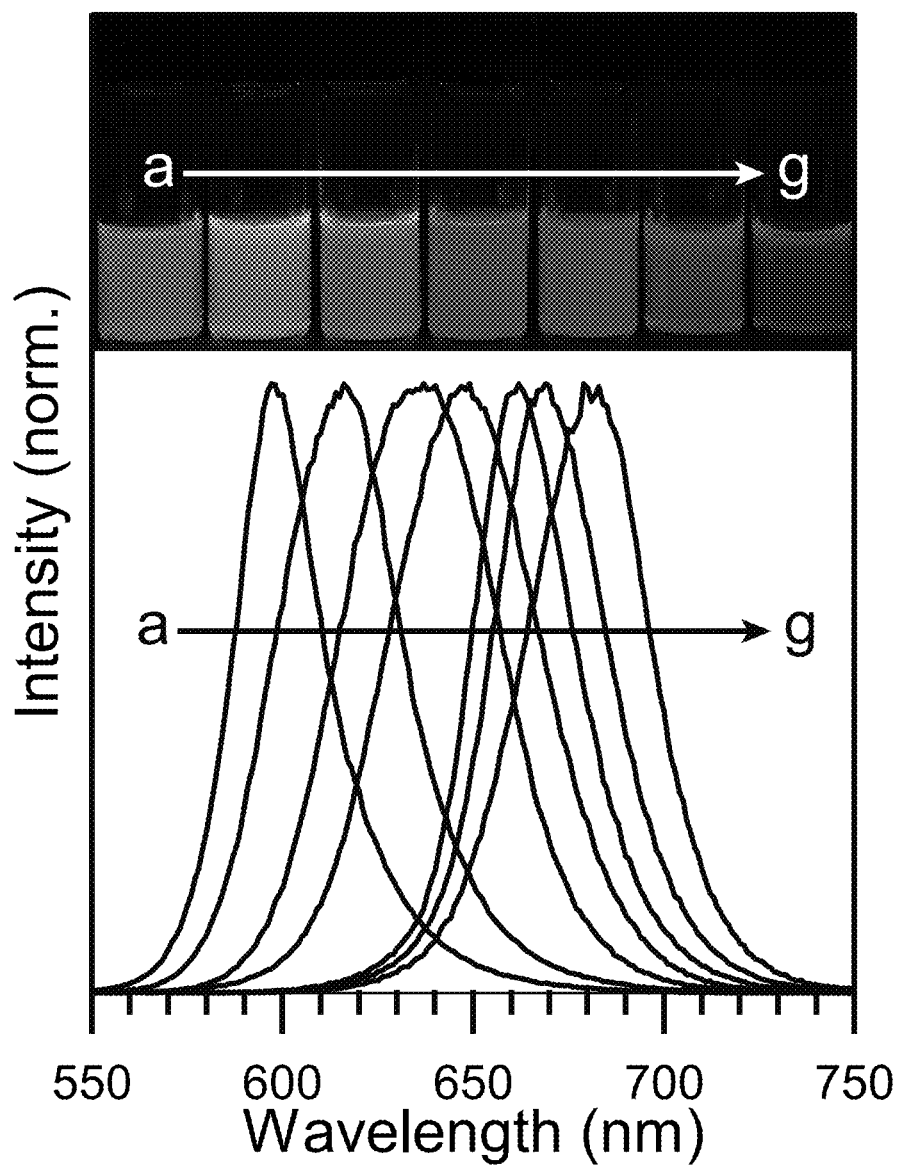
Figure 6:
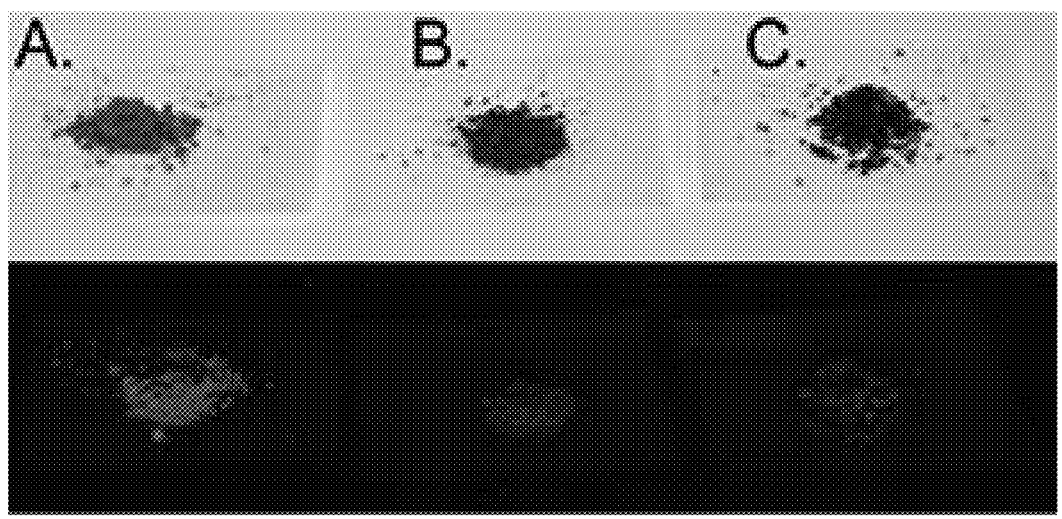
FIG. 6 illustrates luminescent $CsPbI_3$ powders, according to embodiments of the present disclosure; photographs under room light (top row) and UV illumination (bottom row) of $CsPbI_3$ NP powders synthesized at (Column A) 130° C., (Column B) 150° C., and (Column C) 180° C.
Figure 7:
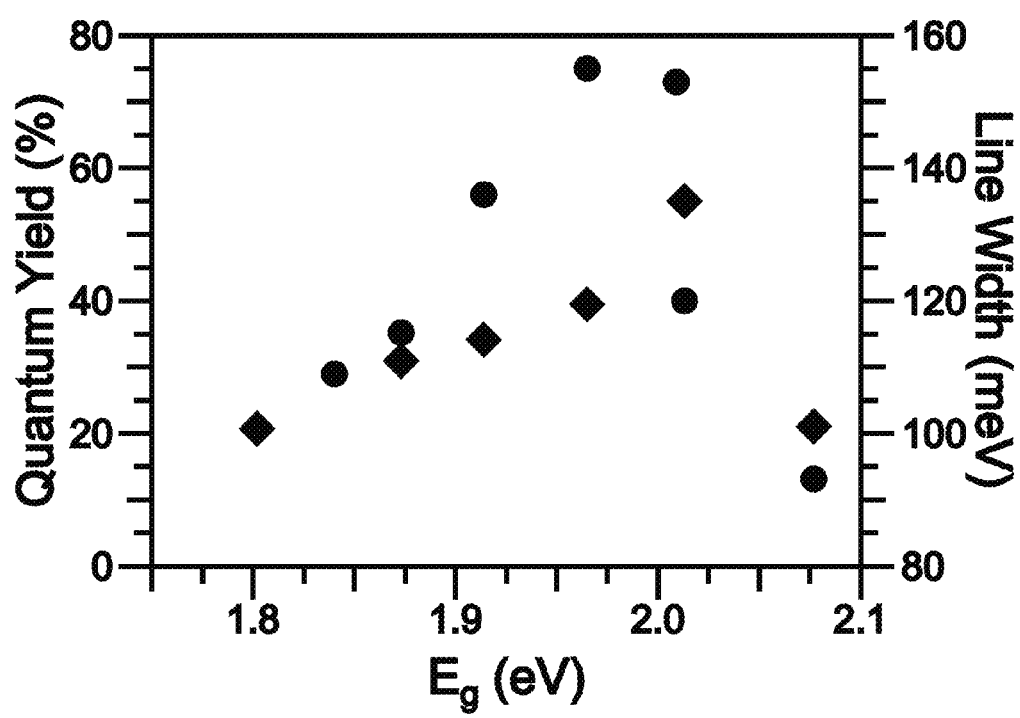
FIG. 7 illustrates full width at half maximum (FWHM) of the emission peak and photoluminescence quantum yield, of films made according to embodiments of the present disclosure; photoluminescence (PL) quantum yield (diamonds, left ordinate) and PL line width (circles, right ordinate) with varying NP size/$E_g$.

FIG. 5A illustrates the tunability of the optical energy bandgap (e.g. between about 600 nm and about 680 nm), due to quantum confinement, in a series of $CsPbI_3$ nanoparticles (e.g. QDs) synthesized at temperatures between 60 and 185° C. $CsPbI_3$ has the largest Bohr excitonic diameter of the $CsPbX_3$ system, and thus the lowest energy excitonic peak, which shifts between 585 and 670 nm corresponding to nanoparticles having sizes between 3 nm and 12.5 nm. The corresponding normalized PL spectra of the samples are shown in FIG. 5B, along with a photograph of the NPs suspended in hexane. Upon ultra-violet (UV) excitation, emission is in the orange (600 nm) to red (680 nm) range corresponding to a bandgap between about 2.07 and about 1.82 eV. Photographs showing PL from dried nanoparticle powders upon UV excitation are shown in FIG. 6. The full width at half maximum of the PL for the smallest NPs is 83 meV, and increases slightly for the larger sizes while the PL quantum yield varied from 21 to 55% for different sizes, as shown in FIG. 7.

The isolation of $CsPbI_3$ in the cubic phase can be difficult due to loss of surface modifier during extraction, causing reversion of the particles to the orthorhombic phase. To maintain adequate surface modifier coverage (e.g. on the surface of nanoparticle), and thereby preserve the cubic phase of the $CsPbI_3$ NPs, an antisolvent approach utilizing anhydrous methyl acetate (MeOAc) was developed and is described herein.

Figure 5C:
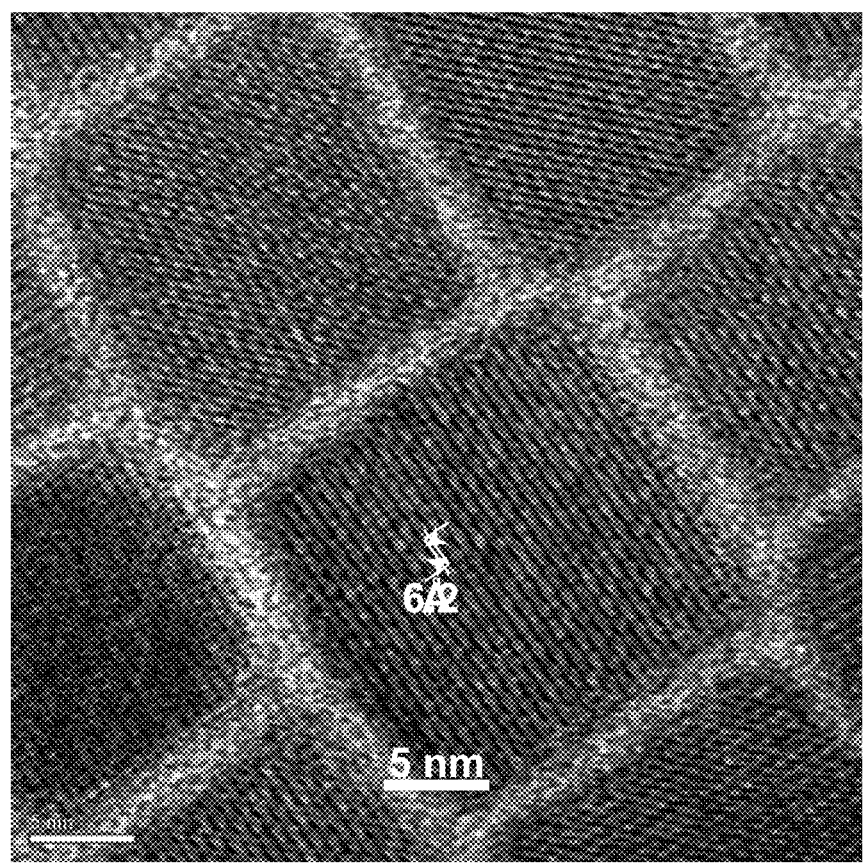
Figure 5D:
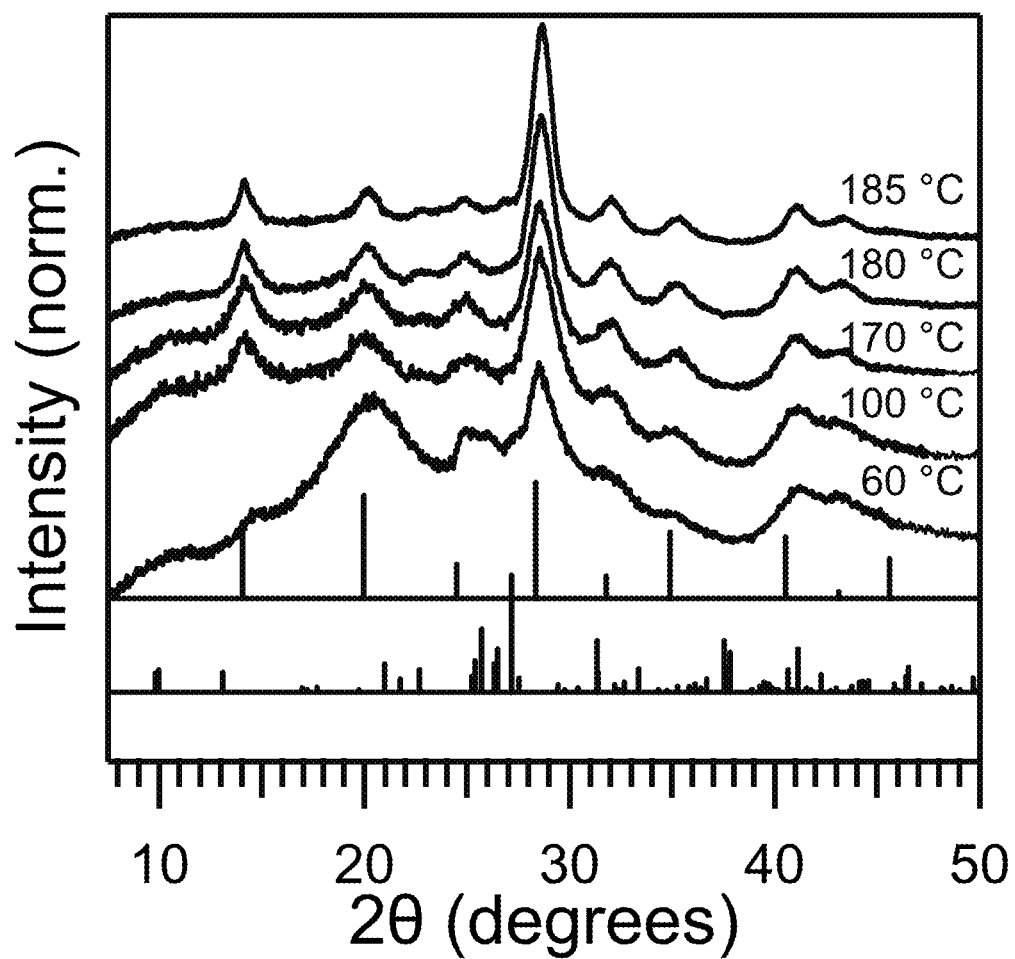
Figure 8:
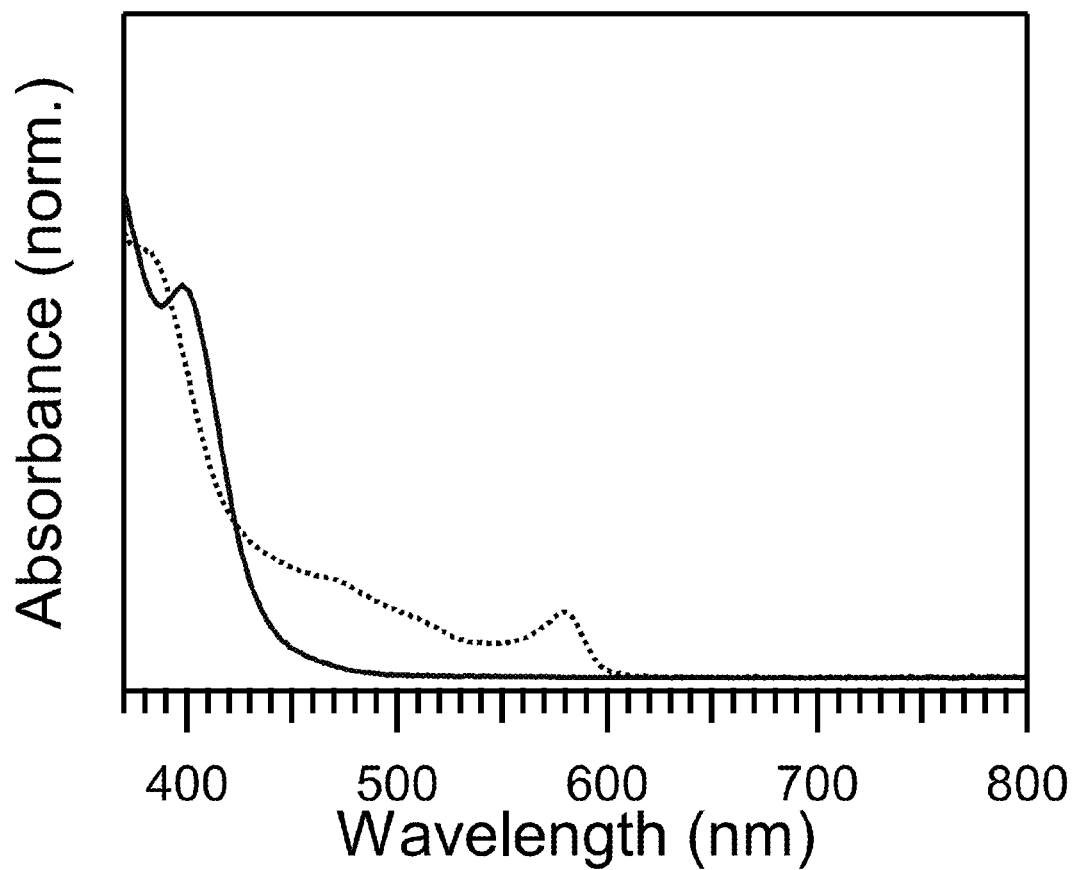
FIG. 8 illustrates the poor phase stability of unwashed NPs. UV-Visible absorption spectra of NPs synthesized at 60° C. and stored in ambient conditions without separating NPs from unreacted precursors for 2 days (unwashed, day zero—dashed line; unwashed, day 2—solid line).
Figure 9A:
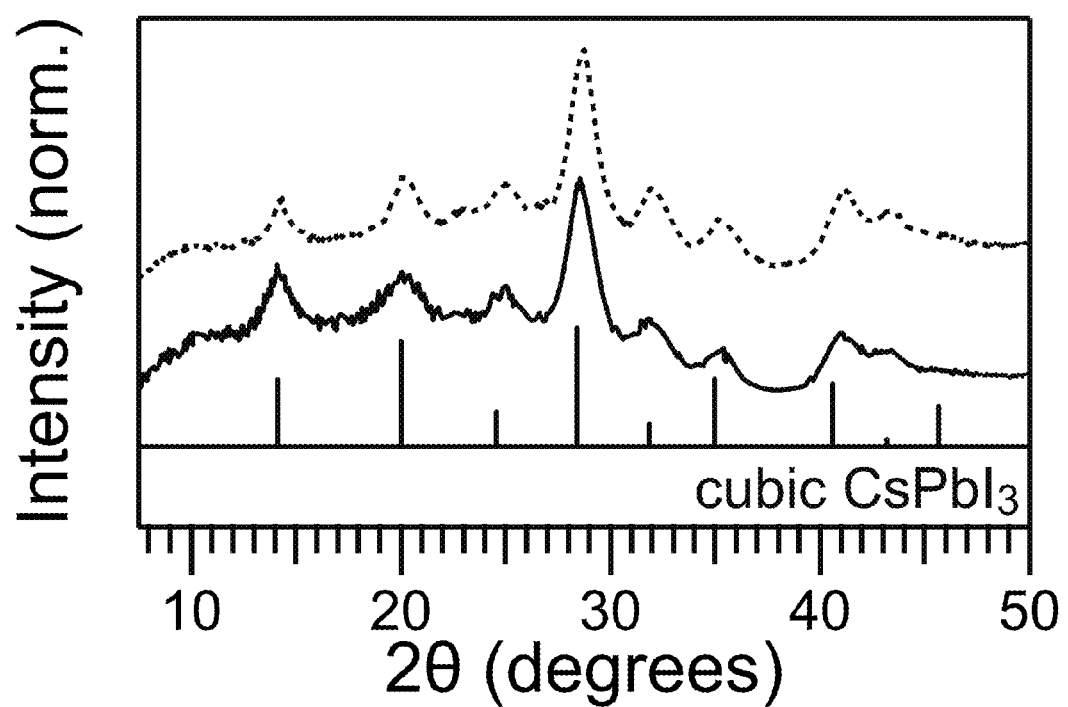
FIGS. 9A-C illustrate phase stability data of $CsPbI_3$ nanoparticles produced according to embodiments of the present disclosure.
Figure 9B:
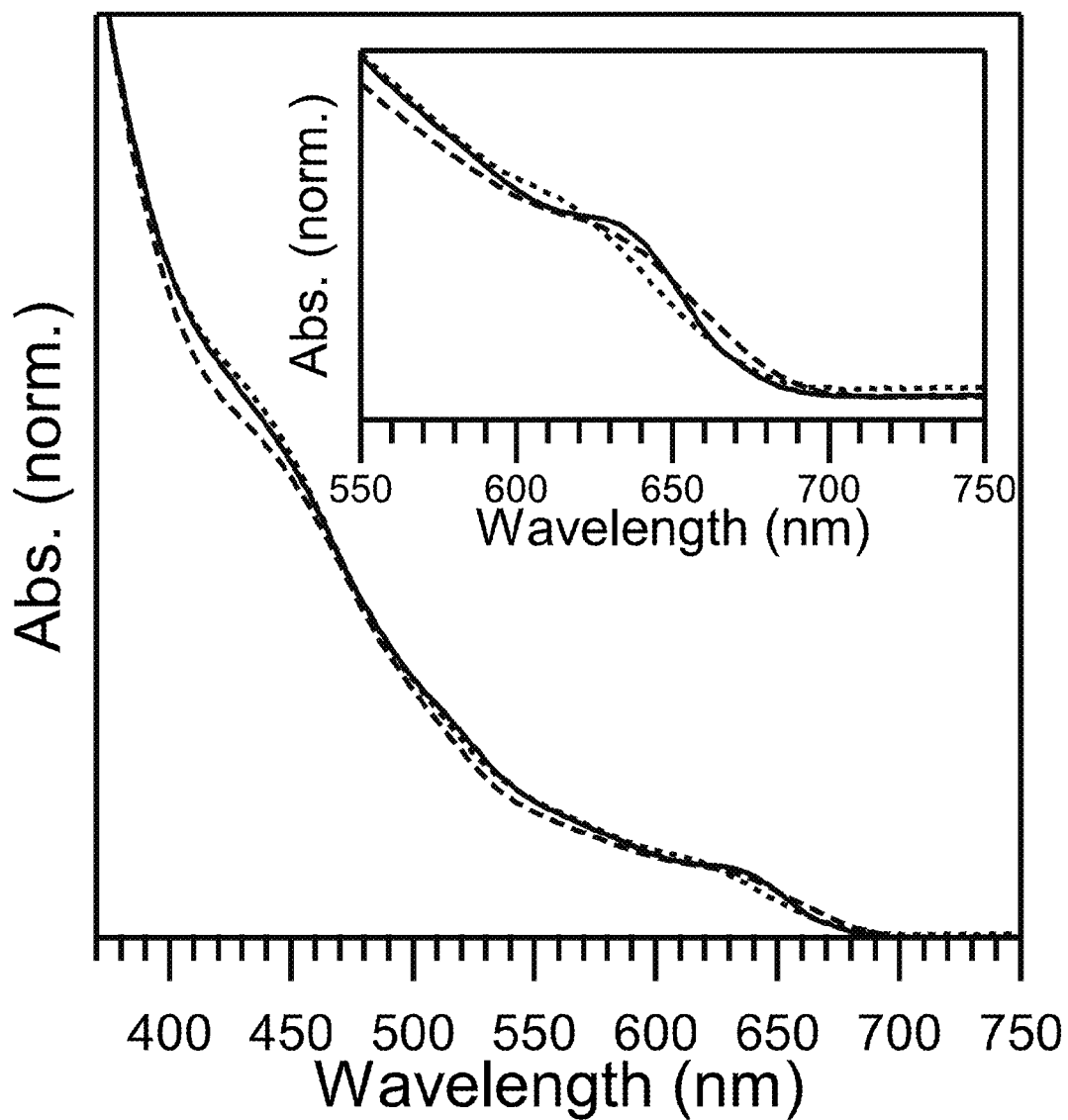

The high-resolution transmission electron TEM image of the sample synthesized at 180° C. (see FIG. 5C) shows an interplanar distance of 0.62 nm, consistent with the (100) plane of cubic phase $CsPbI_3$. These nanoparticles, if left unpurified, transform to the high energy absorbing orthorhombic phase within several days, as shown in FIG. 8. On the other hand, properly treated NPs remain in the cubic phase for months while stored in ambient conditions. FIGS. 9A and 9B illustrate powder XRD patterns and UV-vis absorption spectra, respectively, which confirm the absence of diffraction peaks or the high energy (~3 eV) sharp absorption characteristic of orthorhombic phase formation, despite 60 days of storage in ambient. The nanoparticles also maintained high luminescence throughout the duration of the study, a signature of the presence of the stable cubic phase. Additionally, the nanoparticles remained in the cubic phase (as shown in FIG. 8) even after the solution was cooled to 77 K, further demonstrating the expanded temperature stability of the cubic phase in $CsPbI_3$ nanoparticles.

Figure 9C:
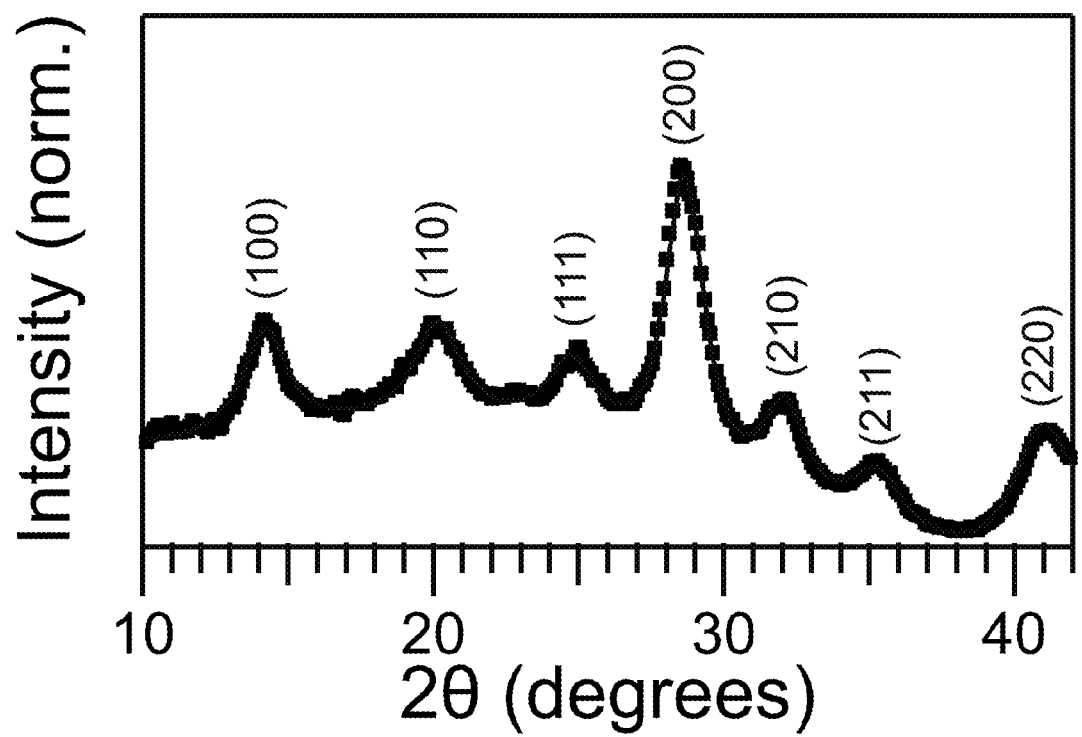

Rietveld refinement of the XRD patterns, shown in FIG. 9C, allows quantification of the contribution from cubic and orthorhombic phases. No orthorhombic phase is found. Additionally, lattice parameters of three different size $CsPbI_3$ NP samples are estimated and shown in Table 1. The lattice parameter values show a size dependence and are lower than the previously measured experimental value (6.2894 Å at 634 K) of bulk cubic $CsPbI_3$. It should be noted that these measurements were performed at 273K.

TABLE 1

Results of the Rietveld refinement.

| Reaction temperature | a (Å) | $R_{wp}$ | NP Size (nm) |
| --- | --- | --- | --- |
| 170° C. | 6.231 ± 0.002 | 3.42 | 9 ± 1 |
| 180° C. | 6.220 ± 0.002 | 6.50 | 10 ± 1 |
| 185° C. | 6.189 ± 0.002 | 7.79 | 17 ± 2 |

Figure 10A:
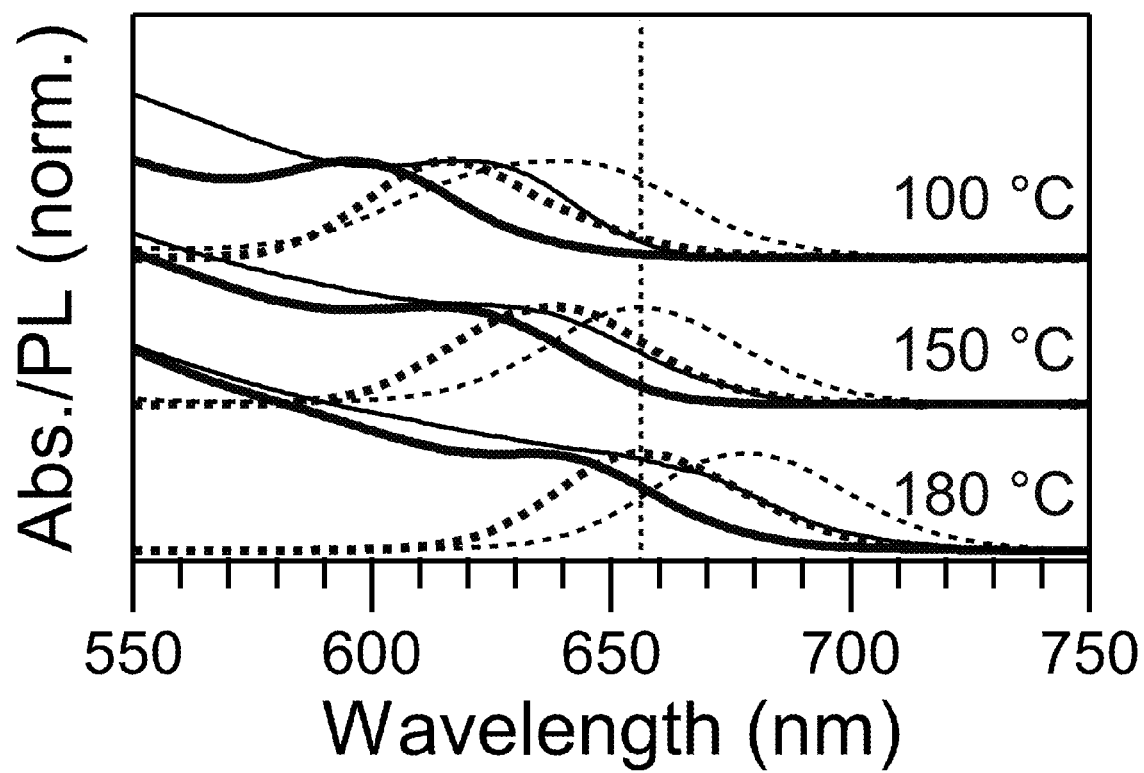
FIGS. 10A and 10B illustrate performance data of $CsPbI_3$ nanoparticle films produced according to embodiments of the present disclosure.
Figure 10B:
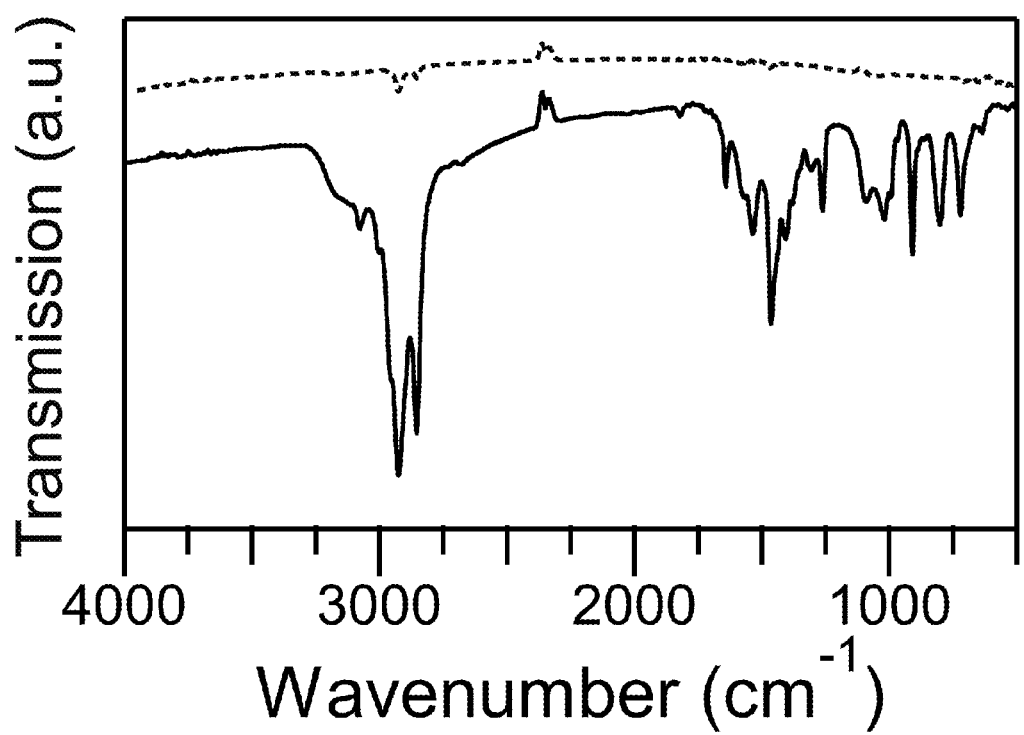

To utilize highly phase-stable $CsPbI_3$ nanoparticles in optoelectronic devices, a method was developed to cast electronically conductive NP films. Film deposition consists of a combined spin-coating and dip-coating process in which nanoparticles are first spin-cast from octane, then dipped in a saturated MeOAc solution of either $Pb(OAc)_2$ or $Pb(NO_3)_2$ (neat MeOAc was used as a control). This process is repeated multiple times, in some embodiments from 3 to 5 times, to produce NP films with thicknesses between 100 nm and 400 nm. FIGS. 10A and 10B illustrate characterization of the treated thin films used for device fabrication. In FIG. 10A, the optical absorption and PL spectra are shown for three samples with indicated reaction temperature. In each case, the film absorbance and PL is red-shifted ~20 nm from that of the nanoparticles in solution, while the tunable emission properties of the films indicate that quantum confinement is preserved, even after casting the film (e.g. heating/drying). Fourier transform infrared (FTIR) spectra show the removal of organic surface modifiers from the film with exposure to neat MeOAc (see FIG. 10B) due to the near absence of C—H modes near 3000 $cm^{-1}$ or below ~2000 $cm^{-1}$ belonging to oleylammonium, oleate, octadecene and other organics.

Figure 11A:
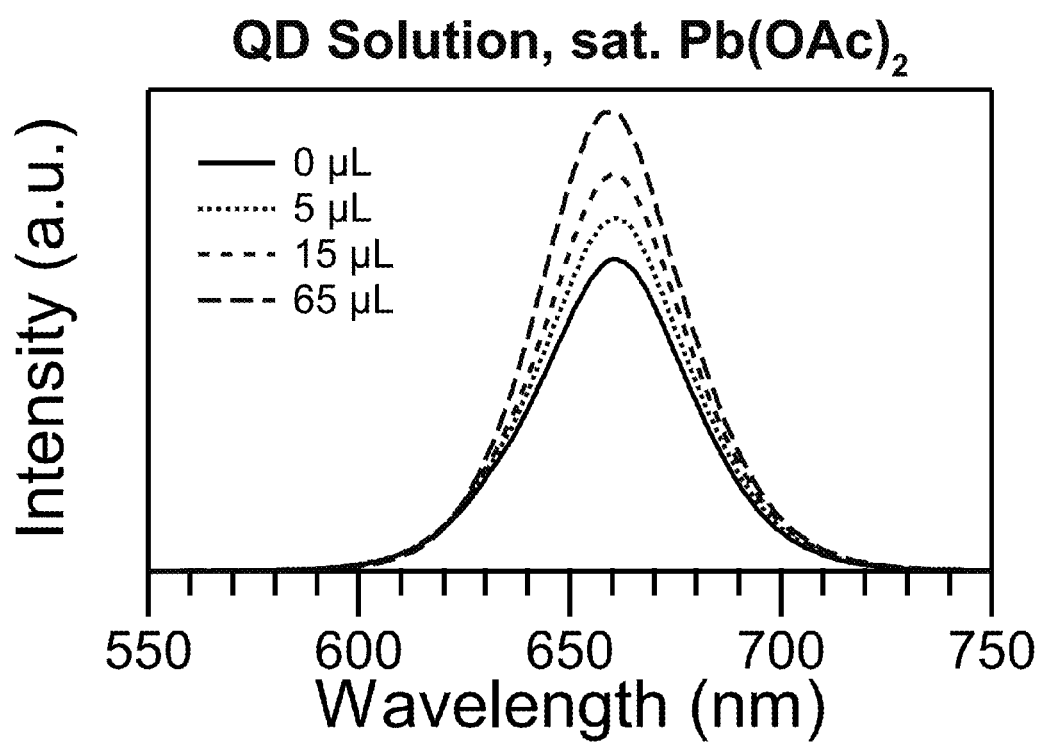
FIGS. 11A-C illustrate the effects of $Pb(OAc)_2$ treatment on photoluminescence, according to embodiments of the present disclosure; Photoluminescence of 3 mL of ~3.6 µg mL$^{-1}$ in hexane, synthesized at 180° C., upon the addition of (FIG. 11A) a saturated solution of $Pb(OAc)_2$ in MeOAc, and (FIG. 11B) neat MeOAc.
Figure 11B:
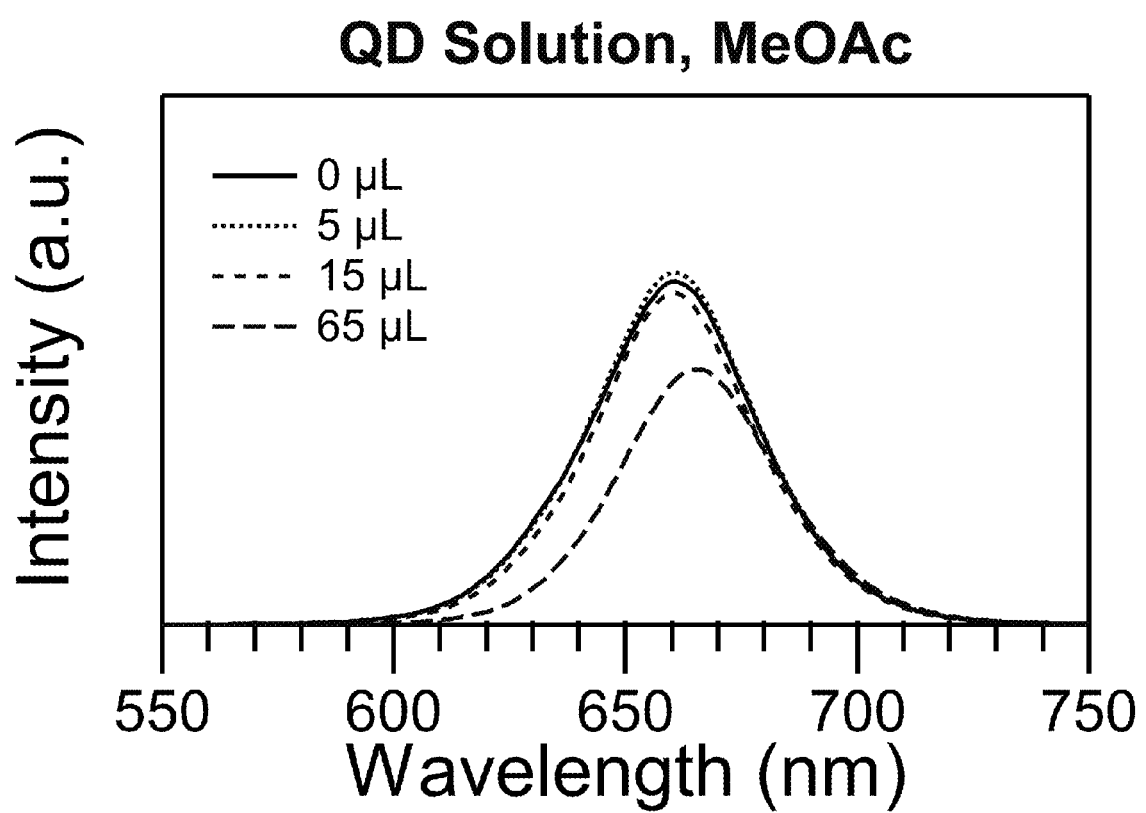
Figure 11C:
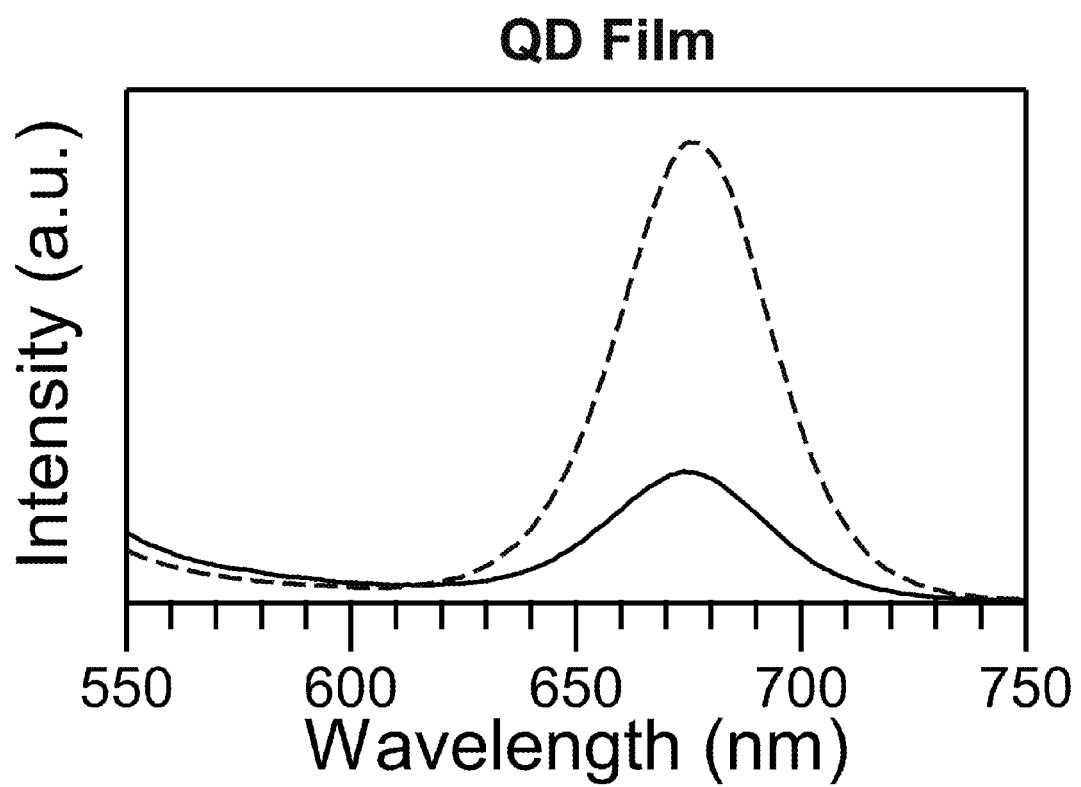

Furthermore, the interaction of $Pb^{2+}$ salts with NPs in solution and on films was investigated by monitoring the fluorescence (see FIGS. 11A-C). Titration of a small amount of $Pb(OAc)_2$ to the NP solution showed an enhancement in PL, suggesting improved surface passivation. Similarly, dip-coating of the NP film in a saturated solution of $Pb(OAc)_2$ in MeOAc results in a significant PL enhancement.

Figure 12A:
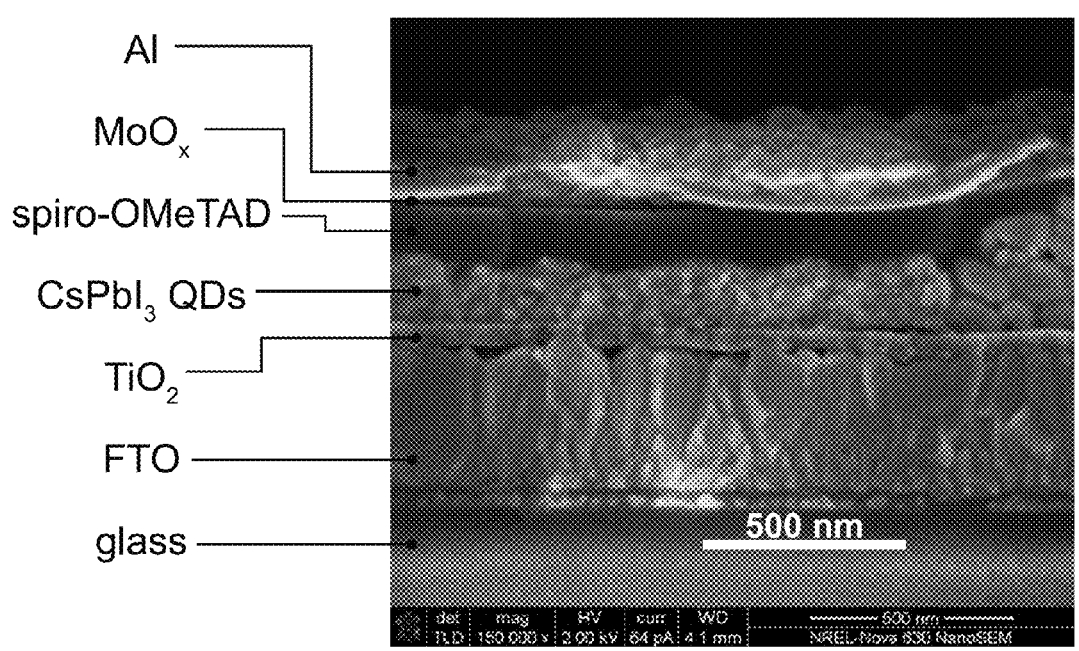
FIGS. 12A-E illustrate data from $CsPbI_3$ solar cells produced according to embodiments of the present disclosure.
Figure 12B:
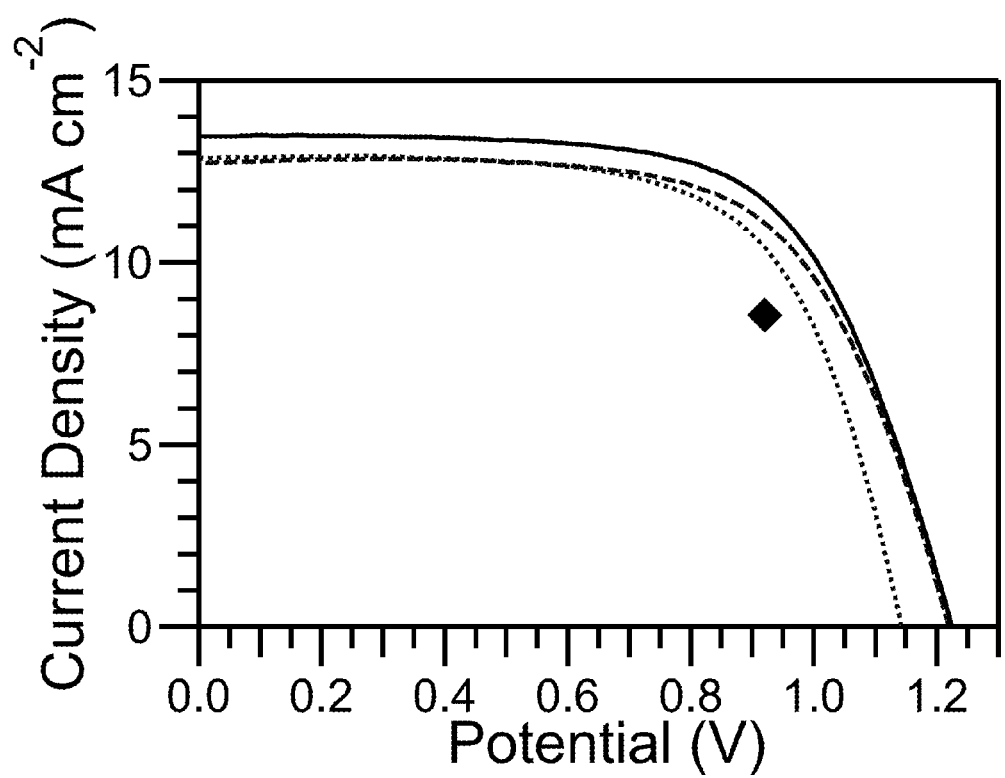
Figure 12C:
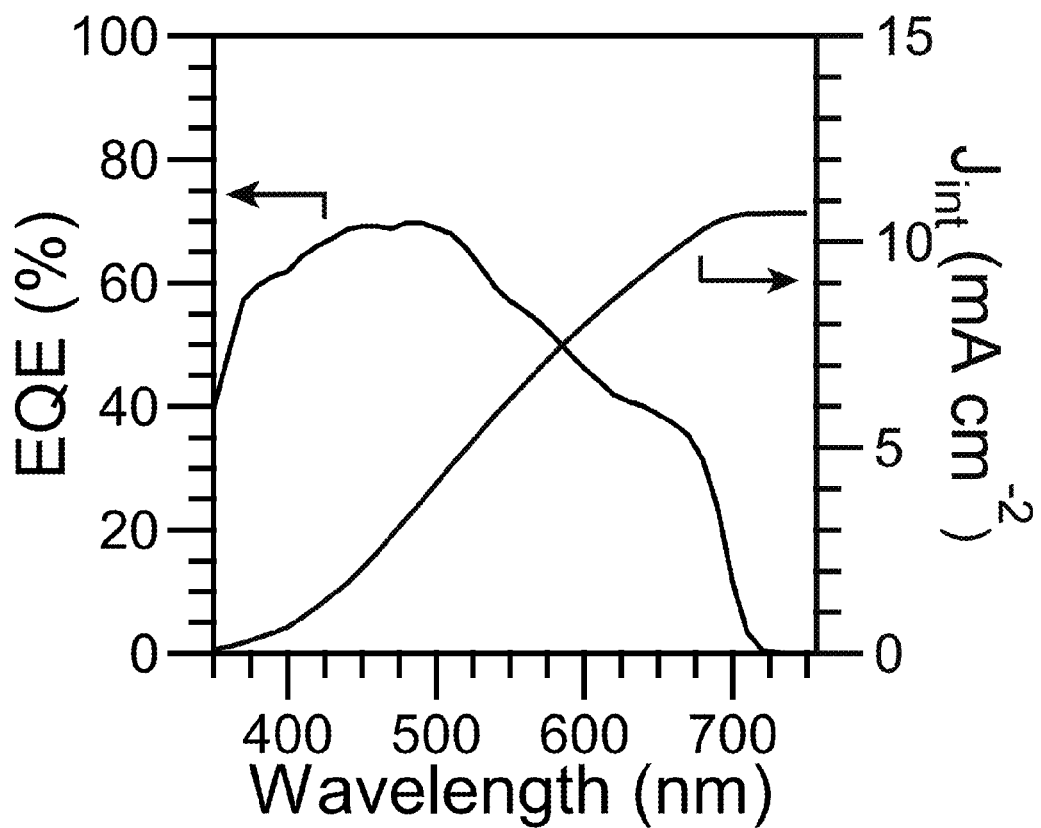
Figure 13:
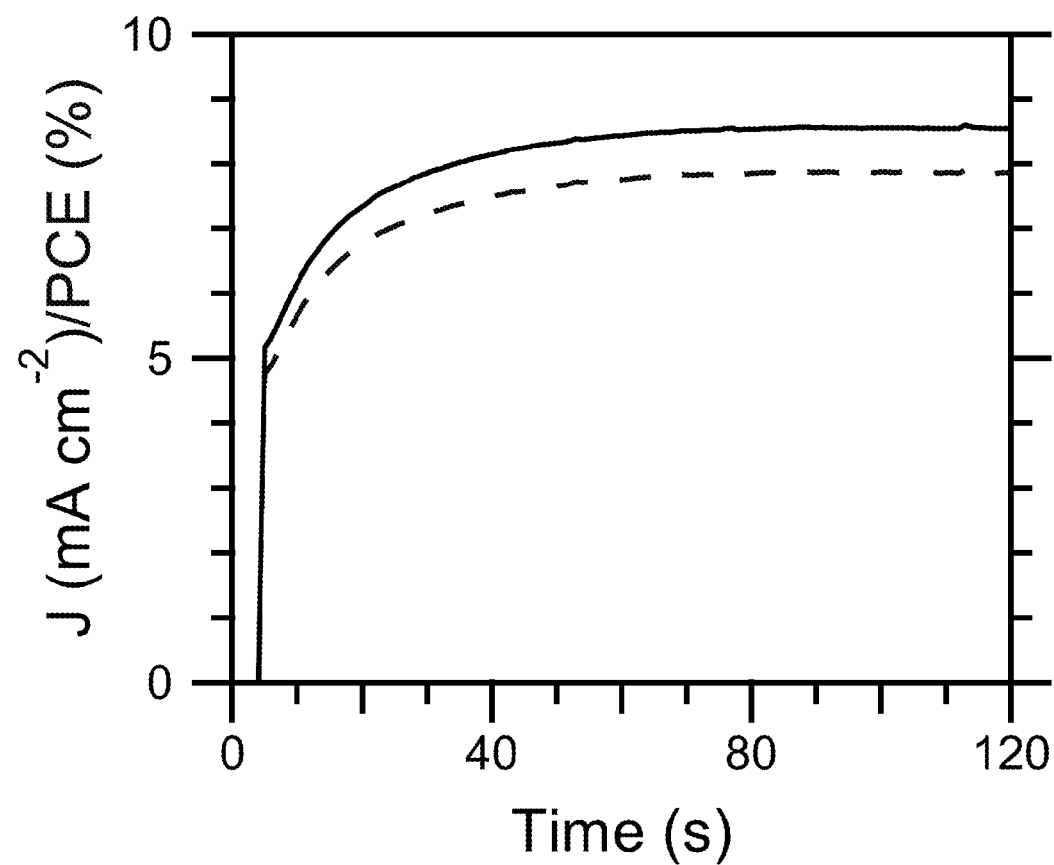
FIG. 13 illustrates the stabilized power output of a device made according to embodiments of the present disclosure; measured current response (solid line) of the device over 120 seconds when held at a constant voltage of 0.92 V. The corresponding power is shown in the dashed line.

$CsPbI_3$ nanoparticles have attractive properties such as strong, sharp absorption and excellent chemical stability compared to the methylammonium analog. Additionally, the nanoparticles exhibit a stable cubic phase at room temperature. Based on these findings, solar cells were fabricated employing $CsPbI_3$ nanoparticles as a photoactive material, resulting very promising results. FIG. 12A illustrates a schematic of a device architecture used, and a corresponding scanning electron micrograph cross section of the device fabricated. The reverse scan current density-voltage (JV) curves show an open-circuit voltage of 1.23 V, and 10.77% power conversion efficiency for devices made and tested completely in ambient conditions (relative humidity ~15-25%) (see FIG. 12B). Furthermore, the device efficiency improved over the course of 15 days with storage of the device in a desiccator in the dark. FIG. 13 shows the stabilized power output of the fabricated device by measuring the current density while the device was biased at 0.92 V. FIG. 12C illustrates the spectral response of the solar cell. Dip-coating spin-cast films in neat MeOAc, and MeOAc saturated with $Pb(OAc)_2$ or $Pb(NO_3)_2$ all perform well (JV-scanned PCE>9%) in the photovoltaic devices fabricated in this work.

Figure 12D:
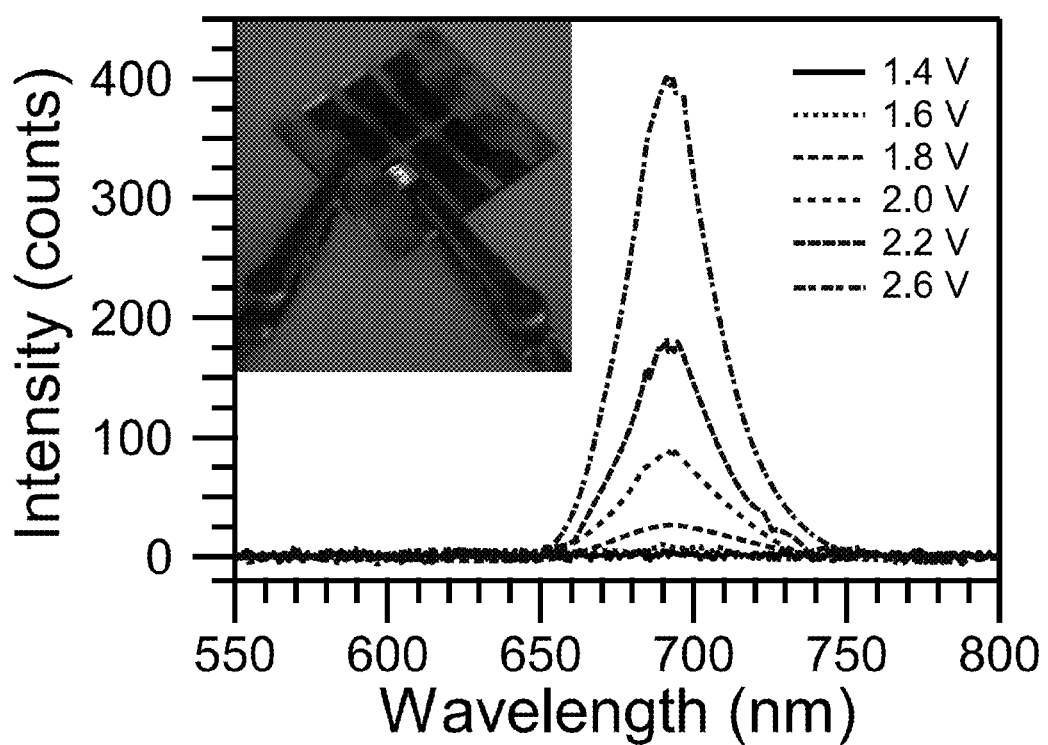
Figure 12E:
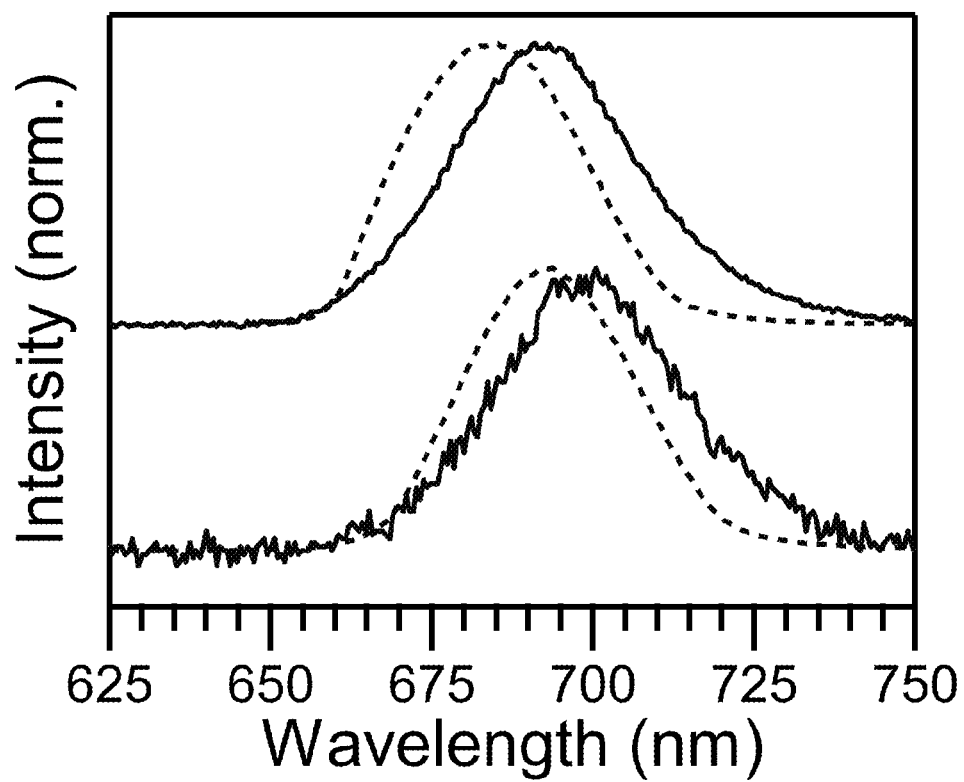

It was also determine that the photovoltaic devices described above can also produce visible electroluminescence (EL) when biased above the $V_{OC}$. FIG. 12D illustrates the EL properties of the NP devices described herein. The EL is characterized by a low turn on voltage near the band gap of the $CsPbI_3$ with increasing intensity at larger applied biases. These spectra also provide direct evidence that quantum confinement is retained in the complete devices as seen by the shift in both the EL and PL spectra of devices with different size NPs (see FIG. 12E).

Materials and Methods

Chemicals: All chemicals were purchased from Sigma Aldrich and used without purification, unless otherwise noted. Cesium carbonate ($Cs_2CO_3$, 99.9%), lead (II) iodide ($PbI_2$ 99.9985%, Alfa Aesar), oleic acid (OA, technical grade 90%), oleylamine (OAm, technical grade 70%), 1-octadecene (ODE, technical grade 90%), toluene (anhydrous 99.8%), hexane (reagent grade ≥95%), octane (anhydrous, ≥99%), 1-butanol (anhydrous 99.8%), methyl acetate (MeOAc, anhydrous 99.5%), lead acetate trihydrate (Pb $(OAc)_2 \cdot 3H_2O$, 99.999%), lead nitrate ($Pb(NO_3)_2$, 99.999%), rhodamine-6G (99%), ethanol (EtOH, 200 proof, ≥99.5%), titanium ethoxide (≥97%), hydrochloric acid (HCl, 37% in water), 2,2',7,7'-tetrakis(N,N-di-p-methoxyphenylamine)-9, 9'-spirobifluorene (spiro-OMeTAD, Lumtec, ≥99.5%), chlorobenzene (anhydrous, 99.8%), 4-tert-butylpyridine, bis(trifluoromethane)sulfonimide lithium salt (Li-TFSI), and acetonitrile (anhydrous, 99.8%).

Synthesis of Cs-oleate as a cesium precursor: 0.5 g of $Cs_2CO_3$, 2 mL OA and 50 mL ODE were added to a 100 mL 3-necked round bottom flask and stirred under vacuum for 30 min at 120° C. The flask was purged with $N_2$ for 10 minutes and then placed back under vacuum. This process of alternately applying vacuum and $N_2$ was repeated 3 times to remove moisture and $O_2$. The reaction was considered complete when the solution was clear, indicating that the $Cs_2CO_3$ had reacted with the OA. The Cs-oleate solution in ODE was stored in $N_2$ until it was needed for the NP synthesis.

Synthesis of colloidal $CsPbI_3$ nanoparticles: $PbI_2$ (1 g) and ODE (50 mL) were stirred in a 500 mL round bottom flask and degassed under vacuum (~0.1 Torr) at 120° C. for 1 hour. The flask was then filled with $N_2$ and kept under constant $N_2$ flow. OA and OAm (5 mL each, pre-heated at ~70° C.) were injected. The flask was put under vacuum again until the $PbI_2$ completely dissolved and the solution was no longer releasing gas (15-30 minutes). The temperature was then varied depending on the desired NP size (60° C. for 3.4 nm, 100° C. for 4.5 nm 130° C. for 5 nm 150° C. for 6.8 nm 170° C. for 8 nm, 180° C. for 9 nm NPs and 185° C. for 12.5 nm). The Cs-oleate (~0.0625 M, 8 mL) precursor, pre-heated at 70° C. under $N_2$ atmosphere, was swiftly injected into the reaction mixture. The reaction mixture turned dark red and the reaction was quenched by immediate immersion of the flask into an ice bath (~5 seconds after injection).

Isolation of colloidal $CsPbI_3$ nanoparticles: Due to the ionic nature of the $CsPbI_3$ NPs and the proposed ionic binding of the surface modifiers, polar non-solvents traditionally used to wash NPs from reaction solutions instead dissolve the $CsPbI_3$ NPs. A variety of low polarity non-solvents were tested: 1-butanol, acetone and ethyl acetate destabilized the NPs and resulted in a yellowish suspension, while MeOAc successfully extracted cubic phase $CsPbI_3$ NPs. The synthesized $CsPbI_3$ NPs were precipitated by adding 200 mL MeOAc (ratio of NP reaction solution: MeOAc is 1:3) and then centrifuged at 8000 RPM for 5 minutes. The wet pellet of NPs in each centrifuge tube was redispersed in 3 mL hexane, precipitated again with an equal volume MeOAc and centrifuged at 8000 RPM for 2 min. The NPs were dispersed in 20 mL of hexane and centrifuged again at 4000 RPM for 5 min to remove excess $PbI_2$ and Cs-oleate. The solution of colloidal $CsPbI_3$ NPs was kept in the dark at 4° C. for 48 hours to remove agglomerated nanoparticles, excess Cs-oleate and Pb-oleate, which solidify at low temperatures. The NP solution was decanted and centrifuged again at 4000 RPM for 5 min before use. For device fabrication, the hexane was dried and the NPs were dissolved in octane at a concentration of ~50 mg/mL. The temperature range of the synthesis is determined by the solubility of the precursors; Cs-oleate will not dissolve in ODE below 60° C. and $PbI_2$ begins to precipitate out of the reaction solution above 185° C.

Characterization: UV-visible absorption spectra were recorded using a Shimadzu UV-3600 UV-Vis-NIR spectrophotometer. Steady state photoluminescence (PL) and room temperature PL quantum yields were measured using a Horiba Jobin Yvon fluoromax-4 spectrophotometer. For quantum yield measurements, the NPs were dispersed in toluene using rhodamine 6G in EtOH as a reference. UV-visible absorption and PL experiments were done in solution and on thin films (prepared as described below). Powder X-ray diffraction data were recorded using a Bruker D8 Discover X-ray diffractometer with a Hi-Star 2D area detector using Cu Kα radiation (1.54 Å). Transmission electron microscopy (TEM) studies were carried out using FEI T30 at 300 kV. TEM grids were prepared by dropping a dilute colloidal solution of NPs in a hexane-octane mixture onto the carbon coated copper grids.

To further explore the structural properties of the NPs, Rietveld analysis of the XRD data was performed using Materials Analysis Using Diffraction (MAUD) software (see FIG. 9C). In this analysis, the background structural parameters (atomic coordinates, occupancies, lattice parameters, etc.), and microstructural parameters (particle size, lattice strain, residual stress, etc.) are refined through a least-squares method. This XRD refinement shows that the cubic model provides quantitative fits of the experimental XRD patterns, while using the experimentally measured lattice parameters of the orthorhombic phase cannot be fitted with the XRD pattern. Due to the extreme peak broadening and increased background of the smallest size, Rietveld refinement of smaller sized $CsPbI_3$ nanoparticles is not possible, however peaks of cubic $CsPbI_3$ nanoparticles are observed to be present in the XRD data of all NP sizes.

Film fabrication: Surface modifier (e.g. ligand) solutions were made by sonicating 10-20 mg of powder (Pb $(OAc)_2 \cdot 3H_2O$ or $Pb(NO_3)_2$) in 20 mL of anhydrous MeOAc for 10 minutes. The excess salt was removed by centrifugation at 4000 RPM for 5 minutes. The NPs (~50 mg/mL in octane) were spin-cast at 1000 RPM for 20 seconds followed by 2000 RPM for 5 seconds on the substrate and swiftly dipped 2-3 times in the surface modifier solution. The film was then rinsed using neat, anhydrous MeOAc, and dried with a stream of air. Films grown using only MeOAc were simply treated with a single rinsing step. This treatment was repeated multiple (3-5) times to form films with thickness between about 100 nm and about 500 nm.

Device fabrication: A ~50 nm $TiO_2$ layer was deposited via a sol-gel method onto pre-patterned FTO on glass substrates (Thin Film Devices, Inc.). Sol-gel $TiO_2$ was prepared by mixing 5 mL EtOH, 2 drops HCl, 125 µL deionized water, and 375 µL of titanium ethoxide resulting in a clear solution. The headspace of the vial was filled with nitrogen and the solution was stirred for 48 hours, and then kept in the freezer until use. The sol-gel was spin-cast at 3000 RPM for 20 seconds, annealed at 115° C. and 450° C. for 30 minutes each. The $CsPbI_3$ NP photoactive layer was deposited using the procedure described above, resulting in a total thickness of ~150 nm. The hole-transporting layer was spin-coated from a solution consisting of 72.3 mg of spiro-OMeTAD in 1 mL of chlorobenzene, 28.8 µL of 4-TBP, and 17.5 µL of Li-TFSI solution (520 mg/mL in acetonitrile). All of the spin-coating processes were performed in ambient. $MoO_3$ was deposited at a rate of 0.2-1.0 Å/s at a base pressure lower than $2 \times 10^{-7}$ torr for a total thickness of 15 nm. Al electrodes were evaporated at a rate ranging from 0.5-2 Å/s for a total thickness of 200 nm.

Figure 14:
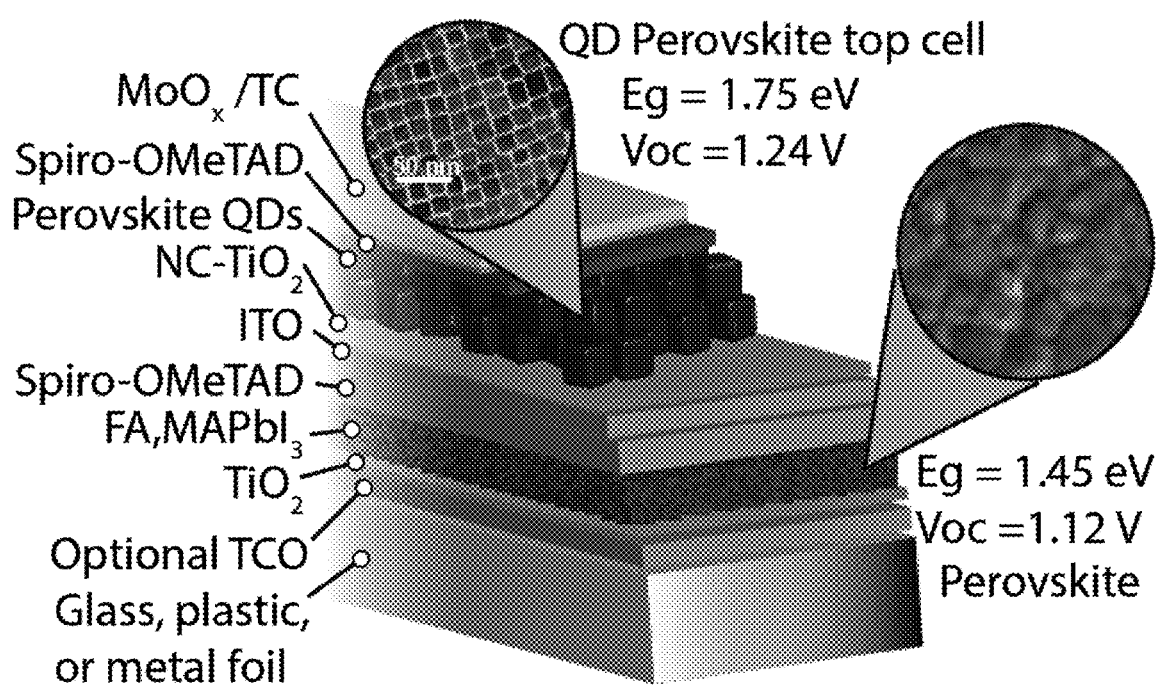
FIG. 14 illustrates a monolithic tandem solar cell that includes perovskite quantum dots, according to some embodiments of the present disclosure.

FIG. 14 illustrates an all-inorganic monolithic tandem solar cell constructed using colloidal $CsPbI_3$ perovskite nanoparticle thin films that exhibit a crystalline phase not seen in thin films of the same material below 300° C. This is the first colloidal nanoparticle perovskite solar cell made and has open circuit voltages in excess of 1.2 V for nanoparticles having a bandgap of 1.75 eV. Such a high voltage has not been seen in any other material with bandgap below 2 eV except single crystal III-V compounds ($GaInP_2$ and AlGaAs). Some embodiments of the present disclosure include $CsPbI_3$ nanoparticle devices that generate 1.23 V for nanoparticles possessing a 1.75 eV bandgap and thus represent a starting point to mimic the top cell of a 31.6% III-V tandem, which is based on a 1.85 eV $GaInP_2$ top cell that delivers 1.45 V at open circuit and 14 $mA/cm^2$ at short circuit. The top cell in this configuration is the most critical toward achieving the final goal, and the perovskite nanoparticles described herein have the greatest voltage of non-III-V systems.

Thus, in some embodiments of the present disclosure, the $V_{OC}$ of a $CsPbI_3$ nanoparticle top cell may be improved by at least one of 1) tuning the Eg via the nanoparticle size effect, 2) tuning the Eg via composition (with A- and/or X-site substitution), 3) improving the PLQY, and 4) minimizing voltage losses at the contacts to nanoparticle layer. In some embodiments of the present disclosure, reducing the size of the nanoparticles and alloying the A-site with $Rb^+$ or the X-site with $Br^-$ may increase the bandgap of the perovskite layer and increase the PLQY. It is anticipated that combination of 1) through 4) will span a 1.8-2.0 eV range to maximize the $V_{OC}$ and the ability to perform photon recycling and luminescent coupling. In some embodiments of the present disclosure, the solar cell devices may contain Spiro-MeOTAD and $TiO_2$ as the hole- and electron-collecting layers, respectively.

Figure 15:
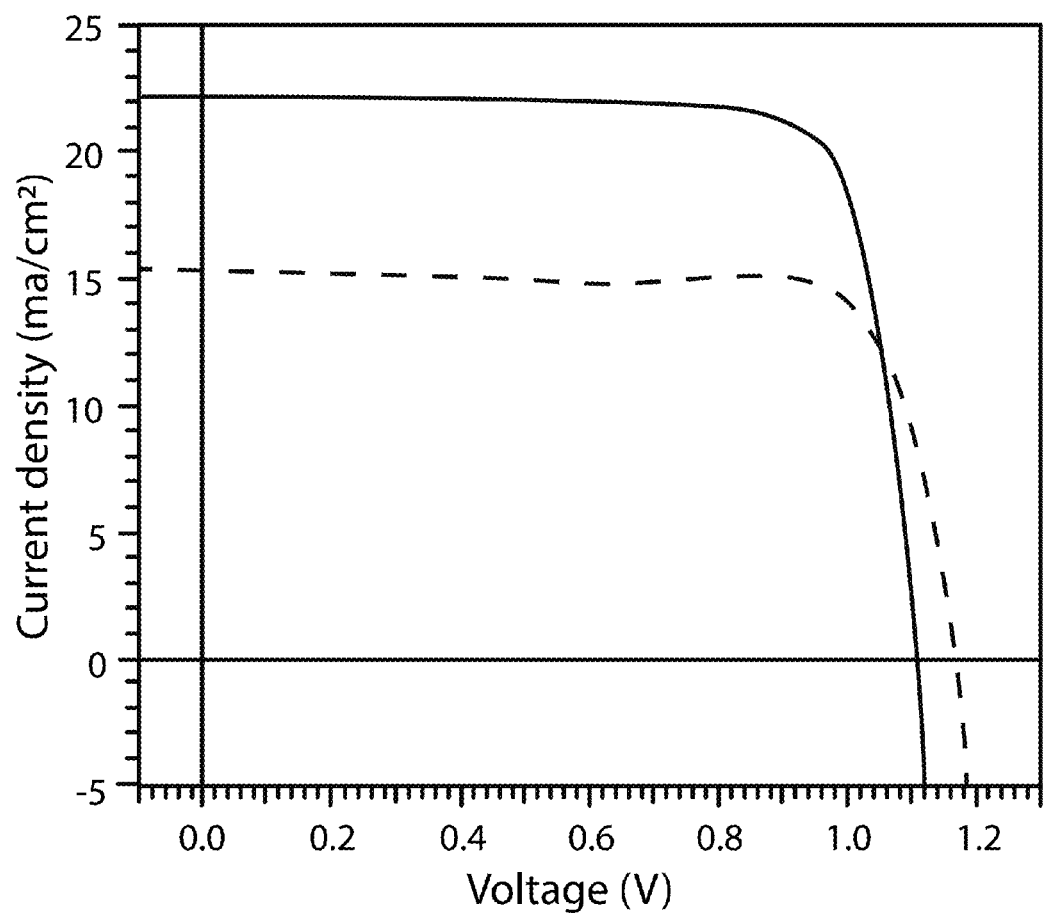
FIG. 15 illustrates current density results attained from a monolithic tandem solar like that illustrated in FIG. 14, according to some embodiments of the present disclosure. (Cs, FA, MA)Pb(I,BR)$_3$ Bottom Cell (solid line); $CsPbI_3$ QD Top Cell (dashed line).

In some embodiments of a monolithic tandem solar cell, the bottom cell may include a highly alloyed perovskite absorber $(FA,Cs,MA)Pb(I,Br)_3$, which is capable of up to a 20% 1-sun efficiency. A combination of the top cell and bottom cell described herein, has been shown to provide the following performance metrics: 12 $mA/cm^2$, 2.334 V and FF of 72.5% yield >20% performance. FIG. 15 illustrates a current density versus voltage plot for an all-inorganic monolithic tandem solar cell constructed using colloidal $CsPbI_3$ perovskite nanoparticle thin films, as described herein.

Figure 16:
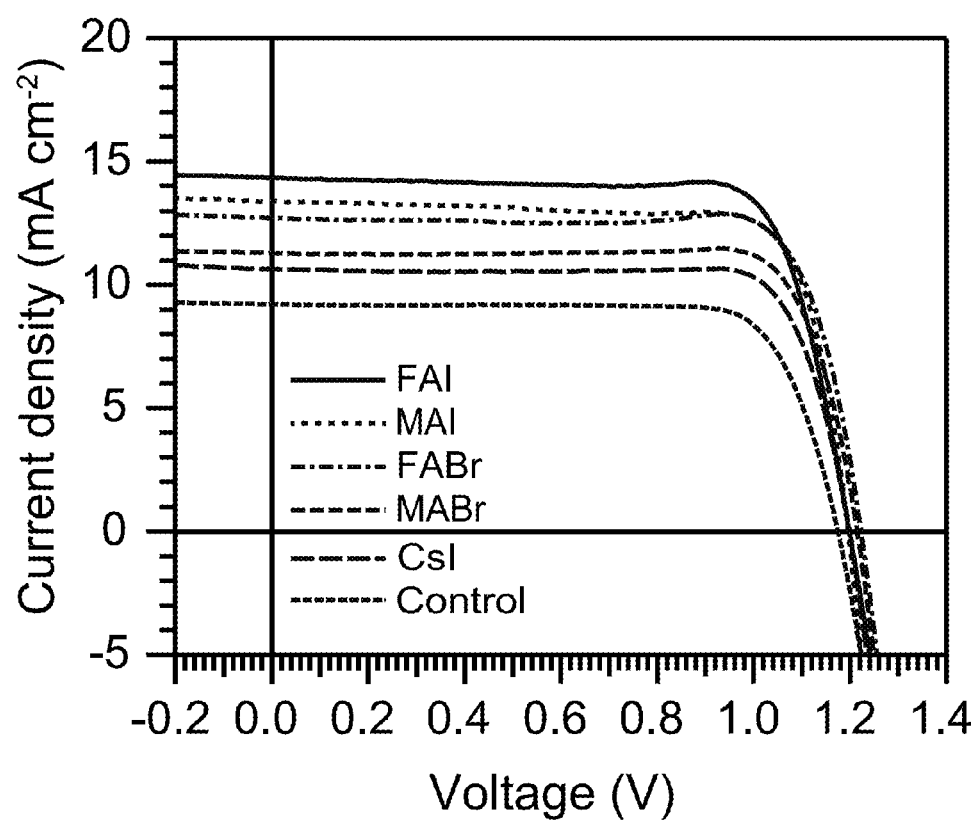
FIG. 16 illustrates current density plots for various post-treatment perovskite films/devices, according to some embodiments of the present disclosure.
Figure 17:
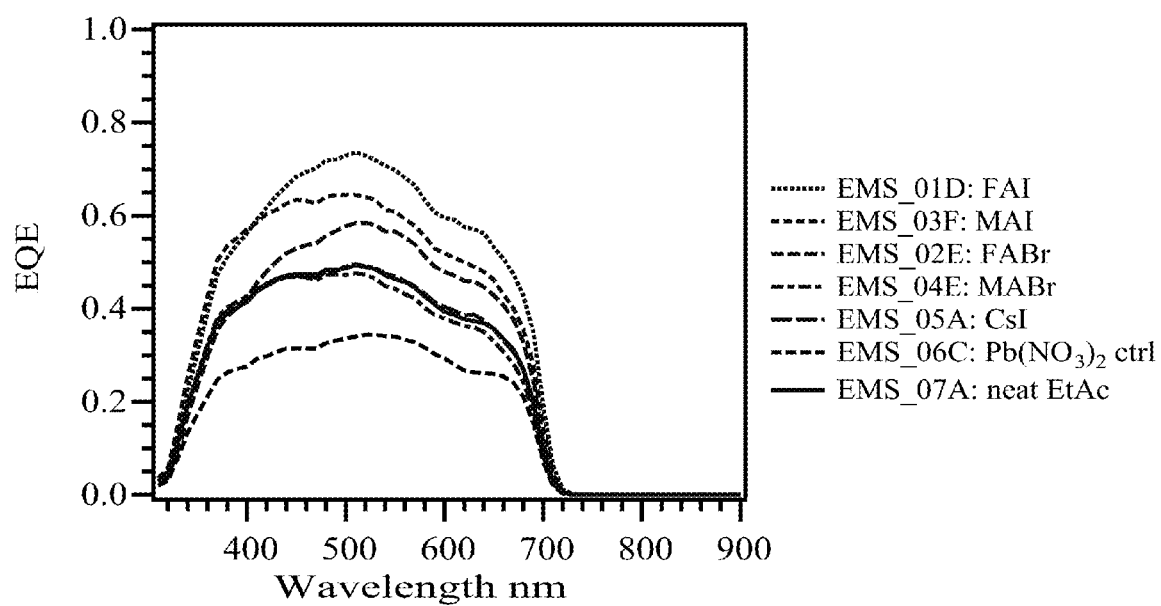
FIG. 17 illustrates external quantum efficiency (EQE) results for various post-treatment perovskite films/devices, according to some embodiments of the present disclosure.
Figure 18:
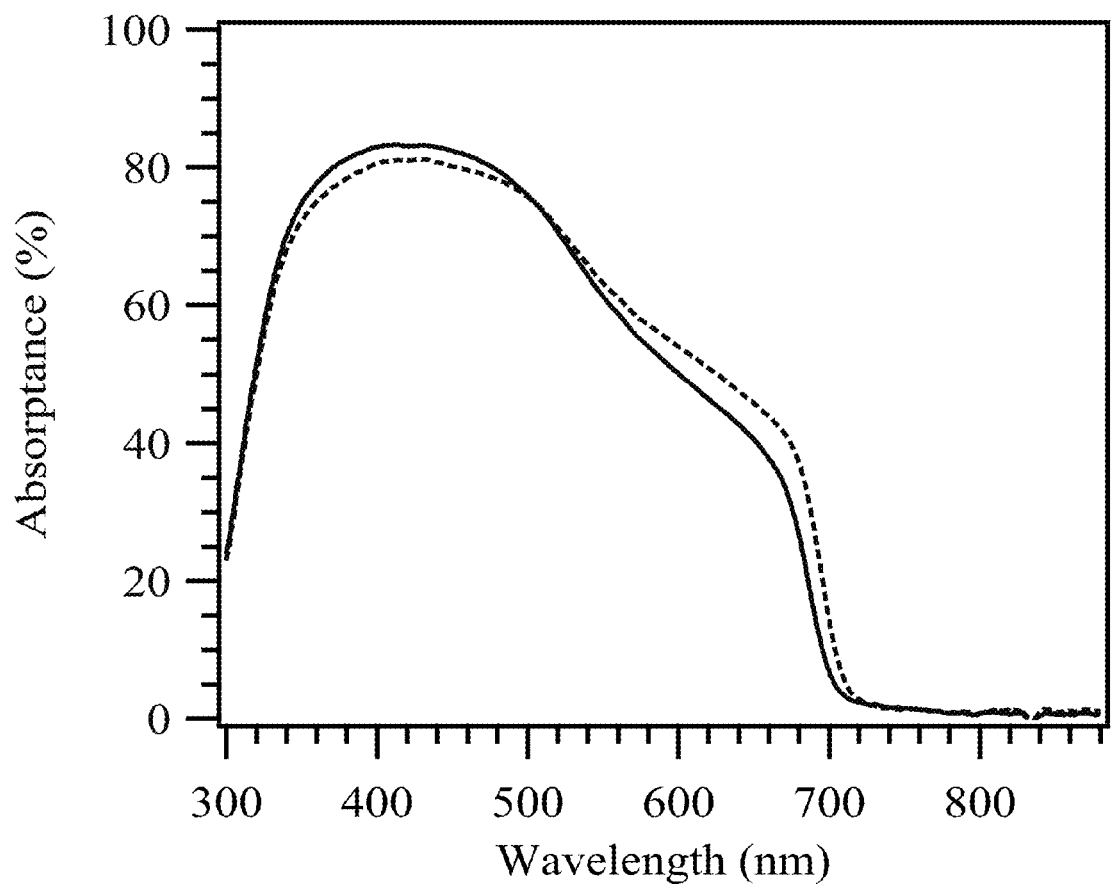
FIG. 18 illustrates light absorption spectra for various post-treatment perovskite films/devices, according to some embodiments of the present disclosure.

As mentioned above, a further aspect of the present disclosure includes treating a film of modified nanoparticles with an AX post-treatment, where X is at least one halogen, and A is a cation with examples include formamidinium ($FA^+$), methyl ammonium ($MA^+$), or $Cs^+$. For example, FIG. 16 compares devices like those shown in FIG. 4 treated with FAI to those treated with neat methyl acetate, which illustrates a ~60% improvement in short-circuit current density ($J_{SC}$), improving the PCE obtained from a current density-voltage (J-V) scan from 8.49% up to 13.76%. Without wishing to be bound by theory, this photocurrent increase may occur due to a broadband improvement in the external quantum efficiency (EQE), as shown in FIG. 17 rather than a change in the EQE onset. The absorbance of the films prepared with the neat EtAc and FAI treatments show similar onsets at ~700 nm, consistent with the EQE spectra, but also show similar overall light absorption FIG. 18, which may indicate that the improvement in $J_{SC}$ arises from enhanced charge carrier collection.

Figure 19:
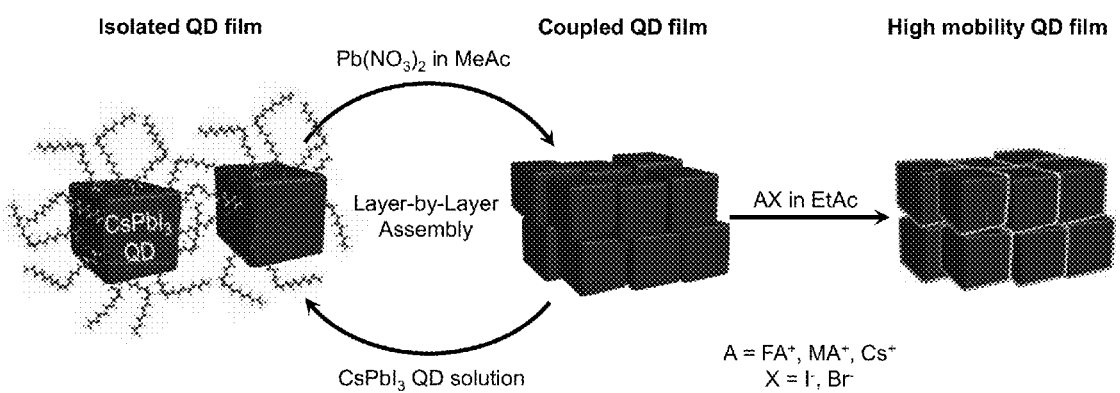
FIG. 19 illustrates a cartoon summary of a method/process for assembling films containing perovskite particles (e.g. nanoparticles/quantum dots) having increased thicknesses due to layer-by-layer assembly of the nanoparticles, followed by a post-treatment step of a metal halide solution (e.g. AX in ethyl acetate), according to some embodiments of the present disclosure.

A variety of AX salts were tested to investigate the generality of the AX post-treatment. To fabricate these AX-treated $CsPbI_3$ nanoparticle films, $CsPbI_3$ nanoparticle films were deposited from octane solutions by spin-coating and treated with a saturated $Pb(NO_3)_2$ solution in MeOAc to partially remove the native surface modifiers, as described above. After building up a layer having thickness between 100 nm and 500 nm $CsPbI_3$ nanoparticle film (3-4 deposition cycles), the films were soaked in a saturated AX salt solution in EtAc (FIG. 19). A series of solar cells was fabricated by applying this AX salt post-treatment as well as a neat EtAc post-treatment and a control device without any post-treatment. The resultant J-V scans are shown in FIG. 16; relevant J-V parameters are provided in Table 2. All of the AX post-treatments improved the PCE compared to the control devices which was primarily the result of increased $J_{SC}$, demonstrating the generality of this surface treatment scheme. The highest PCE of 13.4% was achieved from the FAI treatment with a $J_{SC}$ of 14.37 $mA/cm^2$, which was much better than the neat EtAc control with a PCE and $J_{SC}$, of 8.49% and 9.22 $mA/cm^2$, respectively. $CsPbI_3$ nanoparticle devices treated with MAI and FABr yielded PCEs of 12.6%, with MAI-treated films producing a slightly higher $J_{SC}$ and FABr-treated films producing a slightly higher $V_{OC}$ and FF. As shown previously for FAI-treated films, the differences in $J_{SC}$ are not accompanied by any observable change in the EQE onset (see FIG. 17).

TABLE 2

| AX salt post-treatment | Voc (V) | $J_{sc}$ (mA $cm^{-2}$) | Fill factor | PCE (%) |
|---|---|---|---|---|
| FAI (EtAc) | 1.20 | 14.37 | 0.78 | 13.43 |
| FABr (EtAc) | 1.22 | 12.70 | 0.81 | 12.61 |
| MAI (EtAc) | 1.20 | 13.39 | 0.79 | 12.61 |
| MABr (EtAc) | 1.21 | 11.27 | 0.82 | 11.22 |
| CsI (EtAc) | 1.20 | 10.64 | 0.81 | 10.31 |
| neat EtAc | 1.17 | 9.22 | 0.78 | 8.49 |
| Control (no treatment) | 1.14 | 6.27 | 0.64 | 4.58 |

Figure 20:
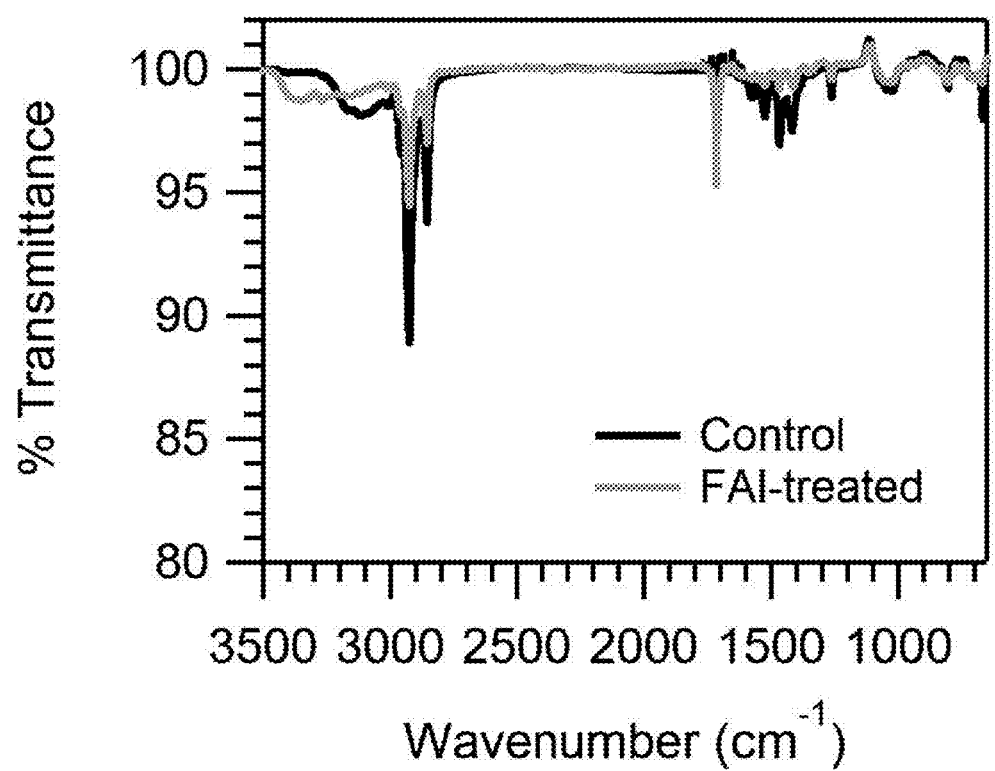
FIG. 20 illustrates FTIR data comparing transmittance of a film that was post-treated using an FAI solution, versus a film that was not post-treated, according to some embodiments of the present disclosure.

While all of the AX post-treatments improved device performance by primarily increasing $J_{SC}$, the role of the FAI treatment on the morphology, optical properties and crystal structure of the CsPbI$_3$ nanoparticle films were investigated to elucidate any changes that may be occurring due to this post-treatment. The presence of FA in the film was verified by transmission FTIR, as shown in FIG. 20, by the emergence of a peak at 1712 cm$^{-1}$ following FAI treatment which is characteristic of the C=N stretch in FA. As it is confirmed that FA is present in the treated films, again without wishing to be bound by theory, four scenarios are hypothesized as to the interaction between FA and the CsPbI$_3$ nanoparticle film: (i) the FA interactions could be limited to the nanoparticle surface, either binding to the nanoparticle or infilling the void space between nanoparticles, (ii) a cation exchange could result in a Cs$_x$FA$_{(1-x)}$PbI$_3$ alloying of the nanoparticle core, (iii) a FAPbI$_3$ matrix could form around the nanoparticles if excess of Pb and I are present, and (iv) the FAI salt could be inducing grain growth in the CsPbI$_3$ nanoparticle film meaning that there are no longer individual nanoparticles present in the treated films and the films now resemble bulk CsPbI$_3$ or alloyed FA$_x$Cs$_{1-x}$PbI$_3$ films which have been shown to achieve $J_{SC}$ values as high as 22 mA/cm$^2$.

Figure 21:
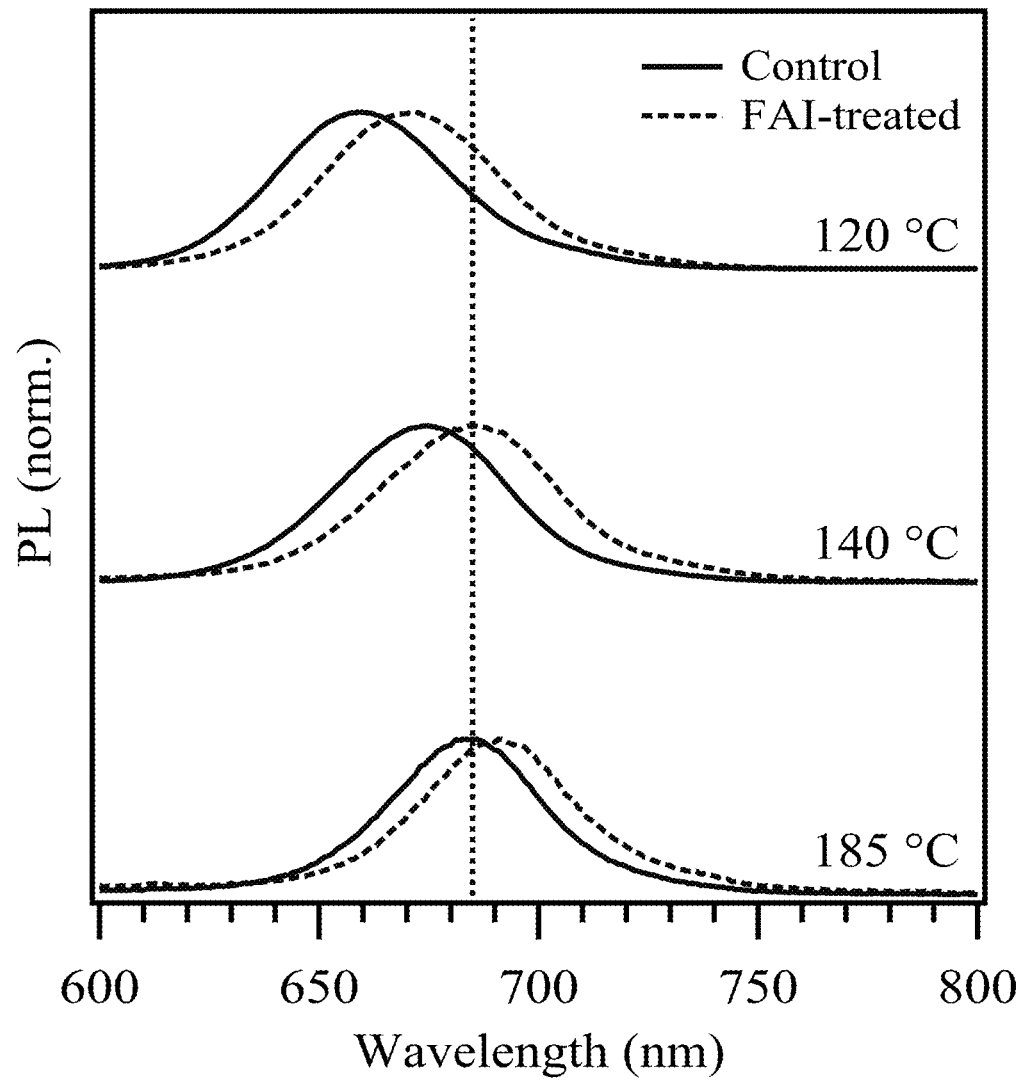
FIG. 21 illustrates photoluminescence (PL) data comparing films that were post-treated using an FAI solution, versus films that was not post-treated, at various post-treatment temperatures, according to some embodiments of the present disclosure.

Considering the EQE onset (see FIG. 17) remained unchanged and only a slight red shift in the absorption onset and photoluminescence is observed (see FIG. 21), drastic changes to chemical composition of the film are unlikely, as one might expect a greater red-shift in the case of a Cs$_x$FA$_{(1-x)}$PbI$_3$ alloy and an absorption onset at ~840 nm in the case of a FAPbI$_3$ matrix. X-ray diffraction patterns before and after the FAI treatment are absent of any detectable peak shifts or new peaks, which would indicate alloying or formation of a new perovskite phase, respectively. Additionally, we see a decrease in the C—H modes associated with the as-synthesized oleate and oleylammonium ligands near 3000 cm$^{-1}$ in the FTIR, suggesting more native surface modifiers have been removed, increasing nanoparticle coupling. To assess whether the increased charge carrier collection is the result of CsPbI$_3$ nanoparticle grain growth induced by the FAI treatment, the PL from film of three different sizes of nanoparticles was measured by varying the reaction temperature with lower reaction temperatures resulting in smaller nanoparticles. After performing the FAI treatment, there was still a significant blue shift in the PL with decreasing nanoparticle size (see FIG. 21) which verifies that quantum confinement is retained following the FAI treatment. High resolution SEM images of the nanoparticle films before and after FAI treatment can readily resolve individual nanoparticles in the films and confirms that the nanoparticle film morphology is maintained after the FAI treatment. Thus, it is clear that the CsPbI$_3$ nanoparticle structure remains intact, despite the addition of FA to the film. Because confinement is clearly preserved in the FAI treated films, it is hypothesized that the slight red-shift seen in the absorbance and PL following FAI treatment arises from the improved electronic coupling between individual nanoparticles. Increasing the wavefunction overlap between neighboring nanoparticles relaxes confinement in the nanoparticles and improves charge carrier transport, shown by the increased $J_{SC}$ in the FAI-treated devices. Therefore, the mobility of the charge carriers of the FAI treated films was investigated using terahertz spectroscopy. A significant enhancement in the charge carrier mobility of FAI-treated CsPbI$_3$ nanoparticle films compared to the untreated counterpart. In addition to measuring the charge carrier mobility of the CsPbI$_3$ nanoparticle films with and without the FAI treatment, the charge carrier mobility of these films compared to lead chalcogenide nanoparticles and perovskite thin films was analyzed. It was found that the charge carrier mobility of the CsPbI$_3$ nanoparticle film is higher than that of the lead chalcogenide nanoparticles, but also significantly lower than that of the thin film perovskites. The lower charge carrier mobility in the CsPbI$_3$ nanoparticle films compared to that of the thin film perovskite is consistent with a hopping transport mechanism in nanoparticle films, whereas the higher charge carrier mobility relative to the lead chalcogenide nanoparticles is likely due to the defect tolerance and lack of mid-gap trap states of perovskite materials.

FURTHER EXAMPLES

Example 1

A composition comprising a particle and a surface species, wherein: the particle has a characteristic length between greater than zero nm and 100 nm inclusively, and the surface species is associated with a surface of the particle such that the particle maintains a crystalline form when the composition is at a temperature between −180° C. and 150° C.

Example 2

The composition of example 1, wherein the characteristic length is between 50 nm and 100 nm inclusively.

Example 3

The composition of example 1, wherein the particle comprises at least one of a metal chalcogenide, a Group III-V material, a metal oxide, or a perovskite.

Example 4

The composition of example 3, wherein the particle comprises the metal chalcogenide comprising at least one of PbS, PbSe, PbTe, CdSe, CdS, CdTe, CuInS, CuInSe, ZnS, ZnSe, ZnTe, HgTe, or CdHgTe.

Example 5

The composition of example 3, wherein the particle comprises the Group III-V material comprising at least one of InP, InAs, GaAs, Si, Ge, or Sn.

Example 6

The composition of example 3, wherein the particle comprises the metal oxide comprising at least one of ZnO, MoO, or TiO$_2$.

Example 7

The composition of example 3, wherein the particle comprises the perovskite comprising at least one of CsPbI$_3$, CsPbBr$_3$, CsPbCl$_3$, RbPbI$_3$, RbPbBr$_3$, or RbPbCl$_3$.

Example 8

The composition of example 7, wherein the crystalline form is substantially cubic.

Example 9

The composition of example 1, wherein the surface species is associated with the surface of the particle by at least one of a covalent bond, an ionic bond, van der Waals interactions, dipole-dipole interactions, Debye interactions, or hydrogen-bonding.

Example 10

The composition of example 9, wherein the surface species is associated with the surface of the particle by at least one ionic bond.

Example 11

The composition of example 1, wherein the surface species comprises at least one of a saturated hydrocarbon, an unsaturated hydrocarbon, a thiol-containing molecule, an acid, or a metal halide.

Example 12

The composition of example 11, wherein thiol-containing molecule comprises at least one of methanethiol, ethanethiol, ethanedithiol, or 1-propanethiol.

Example 13

The composition of example 11, wherein the acid comprises at least one of acetic acid, formic acid, oxalic acid, or mercaptoproprionic acid.

Example 14

The composition of example 11, wherein the surface species comprises at least one of oleate or oleylammonium.

Example 15

The composition of example 11, wherein a metal of the metal halide comprises at least one of lead, germanium, or tin.

Example 16

The composition of example 15, wherein the metal halide comprises at least one of $PbI_2$, $PbBr_2$, $PbCl_2$, $GeI_2$, $GeBr_2$, $GeCl_2$, $SnI_2$, $SnBr_2$, or $SnCl_2$.

Example 17

The composition of example 1, further comprising an organic cation (A) associated with the surface of the particle.

Example 18

The composition of example 17, wherein A comprises at least one of methylammonium (MA) or formamidinium (FA).

Example 19

The composition of example 17, wherein A forms an organic-inorganic perovskite on the surface of the particle.

Example 20

The composition of example 19, wherein the organic-inorganic perovskite comprises $A_xCs_{1-x}PbI_3$, where $0<x<1$.

Example 21

The composition of example 20, wherein the organic-inorganic perovskite comprises $FA_xCs_{1-x}PbI_3$.

Example 22

A device comprising: an active layer comprising: a particle; and a surface species, wherein: the particle has a characteristic length between greater than zero nm and 100 nm inclusively, and the surface species is associated with a surface of the particle such that the particle maintains a crystalline form when the device is at a temperature between −180° C. and 150° C.

Example 23

The device of example 22, wherein the particle is a perovskite comprising at least one of $CsPbI_3$, $CsPbBr_3$, $CsPbCl_3$, $RbPbI_3$, $RbPbBr_3$, or $RbPbCl_3$.

Example 24

The device of example 23, wherein the crystalline form is substantially cubic.

Example 25

The device of example 22, wherein the active layer has a thickness between 100 nm and 500 nm.

Example 26

The device of example 22, further comprising a first charge transport layer and a second charge transport layer, wherein the active layer is positioned between the first charge transport layer and the second charge transport layer.

Example 27

The device of example 26, wherein the first charge transport layer comprises $TiO_2$.

Example 28

The device of example 26, wherein the second charge transport layer comprises 2,2',7,7'-tetrakis(N,N-di-p-methoxyphenylamine)-9,9'-spirobifluorene.

Example 29

The device of example 22, wherein the active layer absorbs light having a bandgap greater than 1.70 eV.

Example 30

The device of example 29, wherein the bandgap is about 1.75 eV.

Example 31

The device of example 22, wherein the active layer is capable of emitting light having a wavelength between 600 nm and 680 nm.

Example 32

A method comprising: dispersing a first surface species and a particle in a mixture comprising an alkyl acetate, wherein: the first surface species is associated with a surface of the particle, the particle has characteristic length between greater than 0 nm and 100 nm, the dispersing removes a first portion of the first surface species from the surface, the particle has a first crystalline form before the dispersing and a second crystalline form after the dispersing, and the second crystalline form is maintained when the particle is at a temperature between −180° C. and 150° C.

Example 33

The method of example 32, wherein the particle comprises a cationic element in the +1 state, a metal, and at least one of a halogen or a pseudohalogen.

Example 34

The method of example 33, wherein the cationic element comprises at least one of cesium, rubidium, potassium, sodium, or copper.

Example 35

The method of example 33, wherein the pseudohalogen comprises at least one of cyanide, cyanate, thiocyanate, or azide.

Example 36

The method of example 32, wherein the characteristic length is between 10 nm and 100 nm inclusively.

Example 37

The method of example 32, wherein the particle comprises at least one of a metal chalcogenide, a Group III-V material, a metal oxide, or a perovskite.

Example 38

The method of example 37, wherein the particle comprises a metal chalcogenide comprising at least one of PbS, PbSe, PbTe, CdSe, CdS, CdTe, CuInS, CuInSe, ZnS, ZnSe, ZnTe, HgTe, or CdHgTe.

Example 39

The method of example 37, wherein the particle comprises a Group III-V material comprising at least one of InP, InAs, GaAs, Si, Ge, or Sn.

Example 40

The method of example 37, wherein the particle comprises a metal oxide comprising at least one of ZnO, MoO, or $TiO_2$.

Example 41

The method of example 37, wherein: the particle comprises a perovskite comprising at least one of $CsPbX_3$, $RbPbX_3$, $CsGeX_3$, $RbGeX_3$, $CsSnX_3$, or $RbSnX_3$, and X is a halogen.

Example 42

The method of example 32, wherein the second crystalline form is substantially cubic.

Example 43

The method of example 32, wherein the first surface species is associated with the surface of the particle by at least one of a covalent bond, an ionic bond, van der Waals interactions, dipole-dipole interactions, Debye interactions, or hydrogen-bonding.

Example 44

The method of example 43, wherein the first surface species is associated with the surface of the particle by at least one ionic bond.

Example 45

The method of example 32, wherein the first surface species comprises at least one of a saturated hydrocarbon, an unsaturated hydrocarbon, a thiol-containing molecule, an acid, or a metal halide.

Example 46

The method of example 45, wherein thiol-containing molecule comprises at least one of methanethiol, ethanethiol, ethanedithiol, or 1-propanethiol.

Example 47

The method of example 45, wherein the acid comprises at least one of acetic acid, formic acid, oxalic acid, or mercaptoproprionic acid.

Example 48

The method of example 32, wherein the first surface species comprises at least one of oleate or oleylammonium.

Example 49

The method of example 32, wherein the first portion is less than 100% of the first surface species and a remainder of the first surface species remains associated with the surface of the particle, after the dispersing.

Example 50

The method of example 32, wherein the alkyl acetate comprises at least one of ethyl acetate, methyl acetate, propyl acetate, or butyl acetate.

Example 51

The method of example 32, wherein the mixture further comprises at least one of acetate ester, acetone, acetonitrile, diethyl ether, or propylene carbonate.

Example 52

The method of example 41, wherein: the mixture further comprises a first salt comprising at least one of an acetate, a nitrate, a carbonate, a thiocyanate, or a phosphate and a metal comprising at least one of lead, germanium or tin, the dispersing results in the first salt forming a second surface modifier comprising the metal and the halogen, the first portion is substantially 100% of the first surface modifier, at least a fraction of the second modifier associates with the surface of the particle, and the second crystalline form is maintained when the particle is at a temperature between −180° C. and 150° C.

Example 53

The method of example 52, wherein the second modifier comprises a metal halide.

Example 54

The method of example 53, wherein the metal halide comprises at least one of $PbI_2$, $PbBr_2$, $PbCl_2$, $GeI_2$, $GeBr_2$, $GeCl_2$, $SnI_2$, $SnBr_2$, or $SnCl_2$.

Example 55

The method of example 52, wherein the salt is present in the mixture at a substantially saturated concentration.

Example 56

The method of example 52, wherein the second surface modifier displaces the first modifier.

Example 57

The method of example 32, wherein the dispersing is by a solution method.

Example 58

The method of example 57, wherein the solution method comprises at least one of spin-coating, dip-coating, or curtain-coating.

Example 59

The method of example 32, wherein the dispersing is by spraying the mixture onto the particle.

Example 60

The method of example 32, further comprising, after the dispersing, removing the alkyl acetate from the particle.

Example 61

The method of example 32, further comprising, after the dispersing, contacting the particle with a solution comprising an aprotic solvent and a second salt, resulting in the forming of a third surface species that associates with the surface of the particle.

Example 62

The method of example 61, wherein the aprotic solvent comprises at least one of methyl acetate or ethyl acetate.

Example 63

The method of example 61, wherein the second salt comprises a cation comprising at least one of lead, germanium, tin, cesium, rubidinium, methylammonium, or formamidinium Example 64

The method of example 63, wherein the second salt comprises an anion comprising a halogen.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A composition comprising:
a plurality of perovskite particles having a cubic crystalline structure, wherein:
each perovskite particle is electronically coupled to its neighboring perovskite particles,
each particle has a characteristic length between greater than zero nanometers (nm) and 100 nm inclusively, and
the perovskite particles remain electronically coupled and maintain the cubic crystalline structure when exposed to a temperature between −180° C. and 150° C.

2. The composition of claim 1, wherein the perovskite particles comprise at least one of a metal chalcogenide, a Group III-V material, or metal oxide.

3. The composition of claim 1, wherein the perovskite particles comprise at least one of $CsPbI_3$, $CsPbBr_3$, $CsPbCl_3$, $RbPbI_3$, $RbPbBr_3$, or $RbPbCl_3$.

4. The composition of claim 1, further comprising an organic cation (A) associated with a surface of at least one of the perovskite particles.

5. The composition of claim 4, wherein A comprises at least one of methylammonium or formamidinium.

6. The composition of claim 1, further comprising a surface species associated with a surface of at least one of the perovskite particles.

7. The composition of claim 6, wherein the surface species is associated with the surface of the at least on perovskite particle by at least one of a covalent bond, an ionic bond, van der Waals interactions, dipole-dipole interactions, Debye interactions, or hydrogen-bonding.

8. The composition of claim 7, wherein the surface species is associated with the surface of the at least one perovskite particle by an ionic bond.

9. The composition of claim 6, wherein the surface species comprises at least one of a saturated hydrocarbon, an unsaturated hydrocarbon, a thiol-containing molecule, an acid, or a metal halide.

10. The composition of claim 9, wherein the surface species comprises at least one of oleate or oleylammonium.

11. The composition of claim 9, wherein a metal of the metal halide comprises at least one of lead, germanium, or tin.

12. The composition of claim 11, wherein the metal halide comprises at least one of $PbI_2$, $PbBr_2$, $PbCl_2$, $GeI_2$, $GeBr_2$, $GeCl_2$, $SnI_2$, $SnBr_2$, or $SnCl_2$.

13. A device comprising:
layer comprising:
a plurality of perovskite particles having a cubic crystalline structure,
wherein:
each perovskite particle is electronically coupled to its neighboring perovskite particles,
each particle has a characteristic length between greater than zero nanometers (nm) and 100 nm inclusively, and
the plurality of particles remains electronically coupled and maintain the cubic crystalline structure when the device is exposed to a temperature between −180° C. and 150° C.

14. The device of claim 13, wherein the perovskite particles comprise at least one of $CsPbI_3$, $CsPbBr_3$, $CsPbCl_3$, $RbPbI_3$, $RbPbBr_3$, or $RbPbCl_3$.

15. A method comprising:
dispersing a first surface species and a particle in a mixture comprising an alkyl acetate, wherein:
the first surface species is associated with a surface of the particle,
the particle has characteristic length between greater than 0 nm and 100 nm,
the dispersing removes a first portion of the first surface species from the surface,
the particle has a first crystalline form before the dispersing and a second crystalline form after the dispersing, and
the second crystalline form is maintained, after the dispersing, when the particle is at a temperature between −180° C. and 150° C.

16. The method of claim 15, wherein the particle comprises at least one of a metal chalcogenide, a Group III-V material, a metal oxide, or a perovskite.

17. The method of claim 16, wherein:
the particle comprises a perovskite comprising at least one of $CsPbX_3$, $RbPbX_3$, $CsGeX_3$, $RbGeX_3$, $CsSnX_3$, or $RbSnX_3$, and
X is a halogen.

18. The method of claim 17, wherein:
the mixture further comprises a first salt comprising at least one of an acetate, a nitrate, a carbonate, a thiocyanate, or a phosphate and a metal comprising at least one of lead, germanium or tin,
the dispersing results in the first salt forming a second surface modifier comprising the metal and the halogen,
the first portion is 100% of the first surface modifier,
at least a fraction of the second modifier associates with the surface of the particle, and
the second crystalline form is maintained when the particle is at a temperature between −180° C. and 150° C.

19. The method of claim 18, wherein the second modifier comprises a metal halide.

20. The method of claim 15, wherein the second crystalline form is cubic.

21. The method of claim 15, wherein the first surface species comprises at least one of a saturated hydrocarbon, an unsaturated hydrocarbon, a thiol-containing molecule, an acid, or a metal halide.

22. The method of claim 15, wherein the first portion is less than 100% of the first surface species and a remainder of the first surface species remains associated with the surface of the particle, after the dispersing.

23. The method of claim 15, wherein the alkyl acetate comprises at least one of ethyl acetate, methyl acetate, propyl acetate, or butyl acetate.

24. The method of claim 15, wherein the mixture further comprises at least one of acetate ester, acetone, acetonitrile, diethyl ether, or propylene carbonate.

25. The method of claim 15, further comprising, after the dispersing, contacting the particle with a solution comprising an aprotic solvent and a second salt, resulting in the forming of a third surface species that associates with the surface of the particle.

* * * * *